(12) United States Patent
Kawamura

(10) Patent No.: US 10,578,139 B2
(45) Date of Patent: Mar. 3, 2020

(54) LOCK STRUCTURE, ELECTRIC CONNECTION BOX AND WIRE HARNESS

(71) Applicant: Yazaki Corporation, Tokyo (JP)

(72) Inventor: Yukihiro Kawamura, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/430,759

(22) Filed: Jun. 4, 2019

(65) Prior Publication Data

US 2019/0376542 A1 Dec. 12, 2019

(30) Foreign Application Priority Data

Jun. 7, 2018 (JP) ................................. 2018-109344

(51) Int. Cl.
*F16B 5/06* (2006.01)
*H02G 3/14* (2006.01)
*H02G 3/08* (2006.01)

(52) U.S. Cl.
CPC .......... *F16B 5/0664* (2013.01); *H02G 3/081* (2013.01); *H02G 3/14* (2013.01)

(58) Field of Classification Search
CPC ........ H05K 5/0221; H02G 3/08; H02G 3/081; H02G 3/086; H02G 3/088
See application file for complete search history.

(56) References Cited

U.S. PATENT DOCUMENTS

| | | | |
|---|---|---|---|
| 2012/0043104 A1* | 2/2012 | Takeuchi | B60R 16/0238 174/50 |
| 2014/0083732 A1* | 3/2014 | Shibata | B60R 16/0238 174/50 |
| 2014/0083733 A1* | 3/2014 | Kamigaichi | B60R 16/0239 174/50 |
| 2014/0131061 A1* | 5/2014 | Hirasawa | H02G 3/088 174/50 |
| 2014/0151112 A1 | 6/2014 | Makino et al. | |
| 2015/0101862 A1 | 4/2015 | Shiraki | |
| 2017/0070040 A1* | 3/2017 | Kawada | H02G 3/088 |

(Continued)

FOREIGN PATENT DOCUMENTS

| | | |
|---|---|---|
| EP | 2 448 076 A2 | 5/2012 |
| JP | 2014-108038 A | 6/2014 |
| JP | 2016-25802 A | 2/2016 |

*Primary Examiner* — Hoa C Nguyen
*Assistant Examiner* — Amol H Patel
(74) *Attorney, Agent, or Firm* — Kenealy Vaidya LLP

(57) ABSTRACT

A lock structure includes an engaged body; and an engaging body that allows the engaged body to be inserted thereinto and removed therefrom. The engaged body includes: an engaged main body insertable into and removable from an engaging body; and an engaged protrusion that protrudes from an outer wall surface of the engaged main body. The engaging body includes: a housing space that is an internal space surrounded by inner wall surfaces of first and second engaging walls and third and fourth engaging walls; an insertion port through which the engaged main body is inserted into the housing space from a distal end of an end portion thereof; a locking hole through which the engaged protrusion is inserted; a communicating port that communicates the housing space to the outside; and a covering portion that covers the end portion of the housed engaged main body.

14 Claims, 15 Drawing Sheets

(56) References Cited

U.S. PATENT DOCUMENTS

| | | | |
|---|---|---|---|
| 2017/0201079 A1* | 7/2017 | Shiraki | B60R 16/02 |
| 2019/0202381 A1* | 7/2019 | Steffka | B60R 16/0238 |
| 2019/0288419 A1* | 9/2019 | Matsuoka | H05K 1/18 |

* cited by examiner

10,578,139 B2

LOCK STRUCTURE, ELECTRIC CONNECTION BOX AND WIRE HARNESS

CROSS-REFERENCE TO RELATED APPLICATION(S)

The present application claims priority to and incorporates by reference the entire contents of Japanese Patent Application No. 2018-109344 filed in Japan on Jun. 7, 2018.

BACKGROUND OF THE INVENTION

1. Field of the Invention

The present invention relates to a lock structure, an electric connection box, and a wire harness.

2. Description of the Related Art

Conventionally, a lock structure for holding two components to be fitted while the components are fitted has been known (Japanese Patent Application Laid-open No. 2016-25802 and Japanese Patent Application Laid-open No. 2014-108038). For example, the lock structure is applied to an electric connection box that houses electronic components therein and an electric connection box that houses electronic components and electric wires therein and constitutes a wire harness together with the electric wires led out to the outside. In an electric connection box, two fitting members for fitting peripheral edge portions of openings are provided as components of a housing. In the electric connection box, a lock structure is used to hold the fitted state of the two fitting members. The lock structure includes an engaged body provided to one of the two fitting members and an engaging body provided to the other fitting member. The lock structure engages the engaged body and the engaging body with each other when fitting the two fitting members, thereby holding the fitted state of the two fitting members.

In an electric connection box, various measures are taken to suppress the intrusion of liquid such as water into the inside of a housing. The measures should be taken for not only a fitted site of two fitting members but also a lock structure if a gap between a engaged body and an engaging body is continuous to the inside of the housing. Thus, the lock structure is desired to suppress the intrusion of liquid into such a gap between the engaged body and the engaging body and, even when liquid has entered the gap, suppress the intrusion of the liquid into the inside of the housing.

SUMMARY OF THE INVENTION

Therefore, an object of the present invention to provide a lock structure, an electric connection box, and a wire harness capable of suppressing the intrusion of liquid.

In order to achieve the above mentioned object, a lock structure according to one aspect of the present invention includes an engaged body; an engaging body that allows the engaged body to be inserted thereinto and removed therefrom along inserting and removing directions opposite to each other, the engaging body being capable of locking the inserted engaged body in the inserting direction and the removing direction, wherein the engaged body includes: an engaged main body that is insertable into and removable from the engaging body; and an engaged protrusion that protrudes from an outer wall surface of the engaged main body, and the engaging body includes: first and second engaging walls arranged so as to be opposed to each other with a gap therebetween in a direction orthogonal to the inserting and removing directions; third and fourth engaging walls arranged so as to be opposed to each other with a gap therebetween in a direction orthogonal to the inserting and removing directions and to the direction in which the first and second engaging walls are arranged so as to be opposed to each other; a housing space that is an internal space surrounded by inner wall surfaces of the first to fourth engaging walls and in which the engaged main body is housed; an insertion port through which the engaged main body is inserted into the housing space from a distal end of an end portion thereof on the inserting direction side; a locking hole that is a through hole provided in the second engaging wall and through which the engaged protrusion is inserted when the engaged main body is housed in the housing space; a communicating port that communicates the housing space to outside on the inserting direction side of the locking hole; and a covering portion that covers an end portion of the housed engaged main body on the inserting direction side.

According to another aspect of the present invention, in the lock structure, it is desirable that the covering portion has a space on the inserting direction side with respect to the distal end of the housed engaged main body.

According to still another aspect of the present invention, in the lock structure, it is desirable that the engaged body includes: a first extending wall that is extended to protrude from the engaged main body in the removing direction and is arranged so as to be opposed to the inner wall surface of the first engaging wall; a second extending wall that is extended to protrude from the engaged main body in the removing direction and is arranged so as to be opposed to the inner wall surface of the third engaging wall after the engaged body is housed; and a third extending wall that is extended to protrude from the engaged main body in the removing direction and is arranged so as to be opposed to the inner wall surface of the fourth engaging wall after the engaged body is housed.

According to still another aspect of the present invention, in the lock structure, it is desirable that the engaged main body includes: first and second engaged walls that are arranged so as to be opposed to each other with a gap therebetween in the opposing arrangement direction; third and fourth wall portions to be engaged that are arranged so as to be opposed to each other with a gap therebetween in a direction orthogonal to the inserting and removing directions and to the opposing arrangement direction; a drainage space surrounded by inner wall surfaces of the first to fourth engaged walls; a first communicating port that communicates the drainage space to the outside on the inserting direction side of the engaged protrusion; and a second communicating port that communicates the drainage space to the outside on the removing direction side of the first communicating port, and the covering portion is arranged on the inserting direction side of the first communicating port.

According to still another aspect of the present invention, in the lock structure, it is desirable that the engaged body is provided on an outer wall surface side of a peripheral wall body in first fitting member, and the engaging body is provided to a first peripheral wall body and a second peripheral wall body of a second fitting member sandwiching an opening peripheral edge portion in the peripheral wall body of the first fitting member, and uses a part of the first peripheral wall body having an opening peripheral edge portion arranged so as to be opposed to an inner wall surface of the opening peripheral edge portion in the peripheral wall body to form the first engaging wall, and uses a part of the second peripheral wall body having an opening peripheral edge portion arranged so as to be opposed to an outer wall surface of the opening peripheral edge portion in the peripheral wall body to form the second engaging wall.

In order to achieve the above mentioned object, an electric connection box according to still another aspect of the present invention includes a housing configured to house an electronic component therein, wherein the housing includes at least first and second fitting members to be fitted to each other, and has a lock structure configured to hold a fitted state of the first and second fitting members, the lock structure includes: an engaged body provided to the first fitting member; and an engaging body that is provided to the second fitting member, allows the engaged body to be inserted thereinto and removed therefrom along inserting and removing directions opposite to each other, and capable of locking the inserted engaged body in the inserting direction and the removing direction, the engaged body includes: an engaged main body that is insertable into and removable from the engaging body; and an engaged protrusion that protrudes from an outer wall surface of the engaged main body, and the engaging body includes: first and second engaging walls arranged so as to be opposed to each other with a gap therebetween in a direction orthogonal to the inserting and removing directions; third and fourth engaging walls arranged so as to be opposed to each other with a gap therebetween in a direction orthogonal to the inserting and removing directions and to the direction in which the first and second engaging walls are arranged so as to be opposed to each other; a housing space which is an internal space surrounded by inner wall surfaces of the first to fourth engaging walls and in which the engaged main body is housed; an insertion port through which the engaged main body is inserted into the housing space from a distal end of an end portion thereof on the inserting direction side; a locking hole which is a through hole provided in the second engaging wall and through which the engaged protrusion is inserted when the engaged main body is housed in the housing space; a communicating port that communicates the housing space to outside on the inserting direction side of the locking hole; and a covering portion that covers an end portion of the housed engaged main body on the inserting direction side.

In order to achieve the above mentioned object, a wire harness according to still another aspect of the present invention includes an electronic component; an electric wire electrically connected to the electronic component; and a housing configured to house the electronic component and the electric wire therein and lead the electric wire out to outside from inside thereof, wherein the housing includes at least first and second fitting members to be fitted to each other, and has a lock structure configured to hold a fitted state of the first and second fitting members, the lock structure includes: an engaged body provided to the first fitting member; and an engaging body that is provided to the second fitting member, allows the engaged body to be inserted thereinto and removed therefrom along inserting and removing directions opposite to each other, and capable of locking the inserted engaged body in the inserting direction and the removing direction, the engaged body includes: an engaged main body that is insertable into and removable from the engaging body; and an engaged protrusion that protrudes from an outer wall surface of the engaged main body, and the engaging body includes: first and second engaging walls arranged so as to be opposed to each other with a gap therebetween in a direction orthogonal to the inserting and removing directions; third and fourth engaging walls arranged so as to be opposed to each other with a gap therebetween in a direction orthogonal to the inserting and removing directions and to the direction in which the first and second engaging walls are arranged so as to be opposed to each other; a housing space which is an internal space surrounded by inner wall surfaces of the first to fourth engaging walls and in which the engaged main body is housed; an insertion port through which the engaged main body is inserted into the housing space from a distal end of an end portion thereof on the inserting direction side; a locking hole which is a through hole provided in the second engaging wall and through which the engaged protrusion is inserted when the engaged main body is housed in the housing space; a communicating port that communicates the housing space to outside on the inserting direction side of the locking hole; and a covering portion that covers an end portion of the housed engaged main body on the inserting direction side.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

Figure 1:
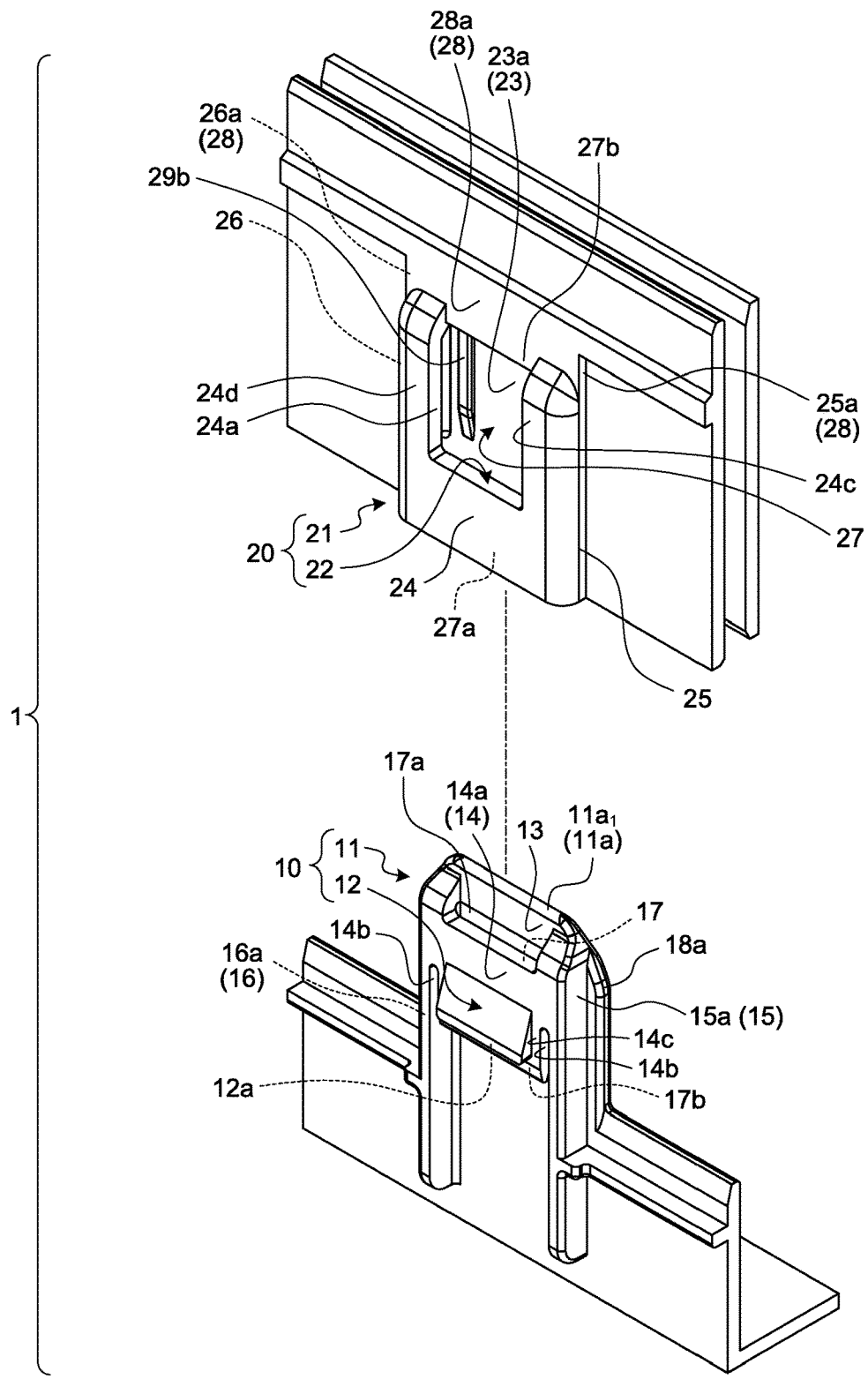
FIG. 1 is a perspective view of a lock structure according to an embodiment before engagement.

A lock structure, an electric connection box, and a wire harness according to an embodiment of the present invention are described in detail below with reference to the drawings. The present invention is not limited by the embodiment.

Embodiment

A lock structure, an electric connection box, and a wire harness according to one embodiment of the present invention are described with reference to FIG. 1 to FIG. 15.

Reference numeral 1 in FIG. 1 to FIG. 6 denotes a lock structure in the present embodiment configured to hold two fitting members while the fitting members are fitted together. For example, the two fitting members are members constituting a housing 110 as described later. The lock structure 1 includes an engaged body 10, and an engaging body 20 that allows the engaged body 10 to be inserted thereinto and removed therefrom along inserting and removing directions opposite to each other and which can lock the inserted engaged body 10 in the inserting direction and the removing direction. The engaged body 10 and the engaging body 20 are molded with insulating material, such as synthetic resin. In the lock structure 1, the engaged body 10 is provided to one fitting member, and the engaging body 20 is provided to the other fitting member. In the following, when "inserting direction" or "removing direction" is simply referred to, it means the inserting direction or the removing direction of the engaged body 10 with respect to the engaging body 20.

The engaged body 10 has a main body (hereinafter referred to as "engaged main body") 11 that can be inserted into and removed from the engaging body 20, and a protruding portion (hereinafter referred to as "engaged protrusion") 12 that protrudes from an outer wall surface of the engaged main body 11 (FIG. 1 to FIG. 6).

Figure 2:
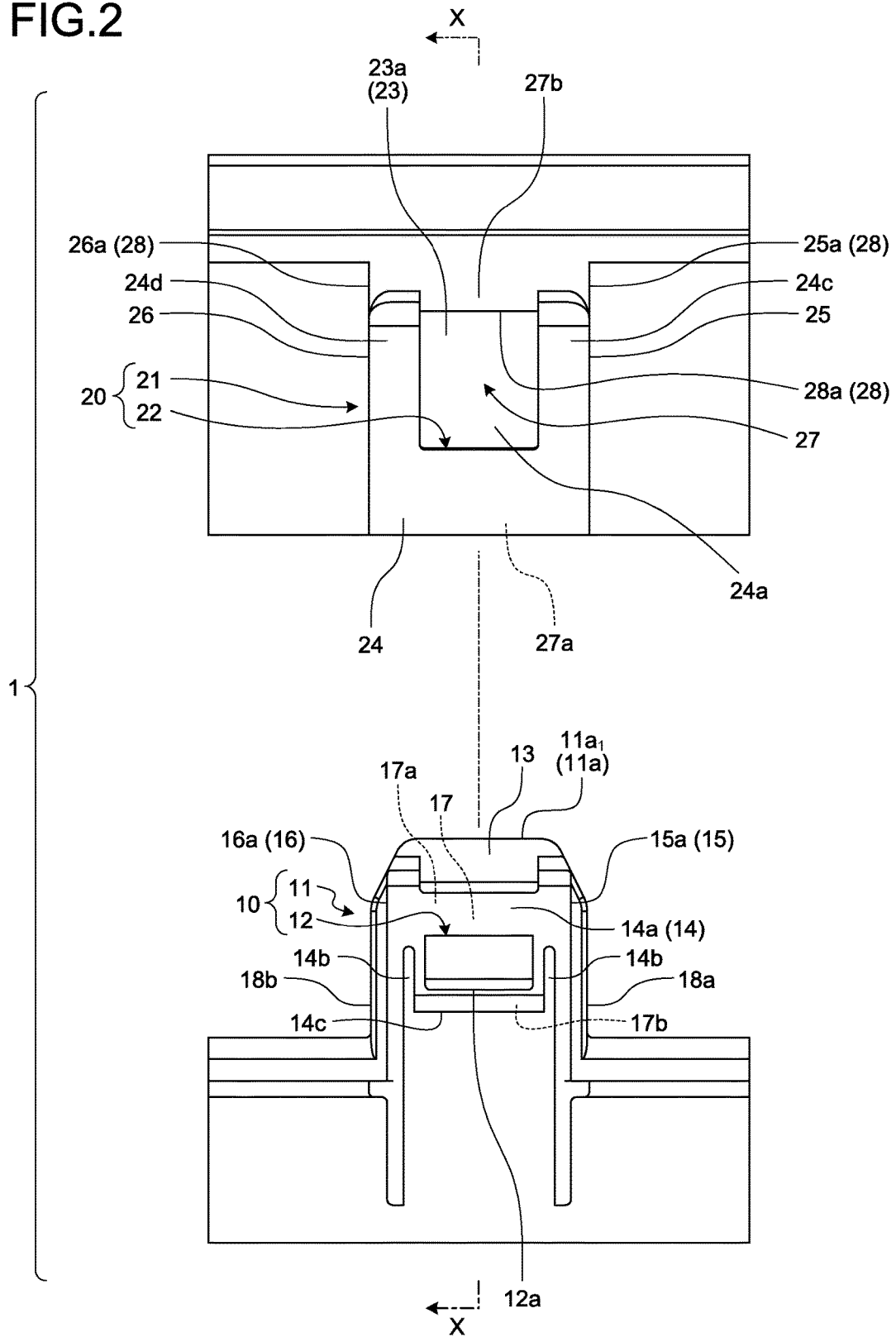
FIG. 2 is a front view of the lock structure in the embodiment before engagement.
Figure 3:
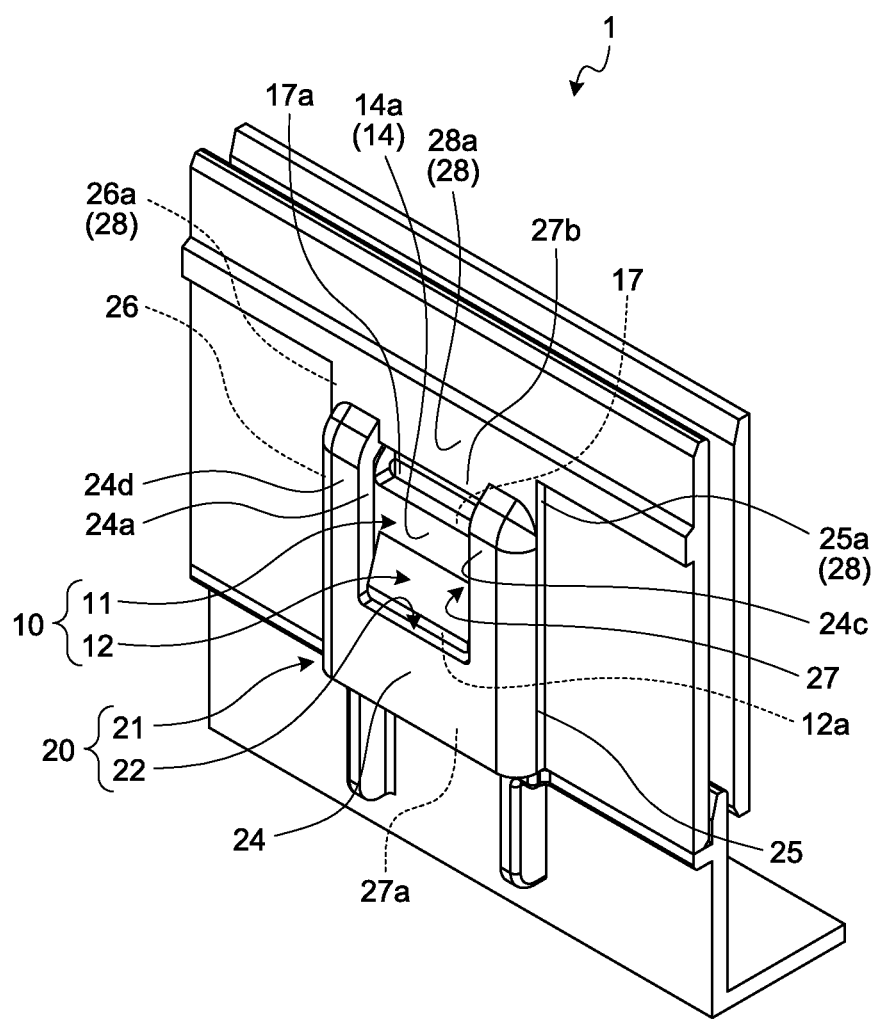
FIG. 3 is a perspective view of the lock structure in the embodiment after engagement.
Figure 4:
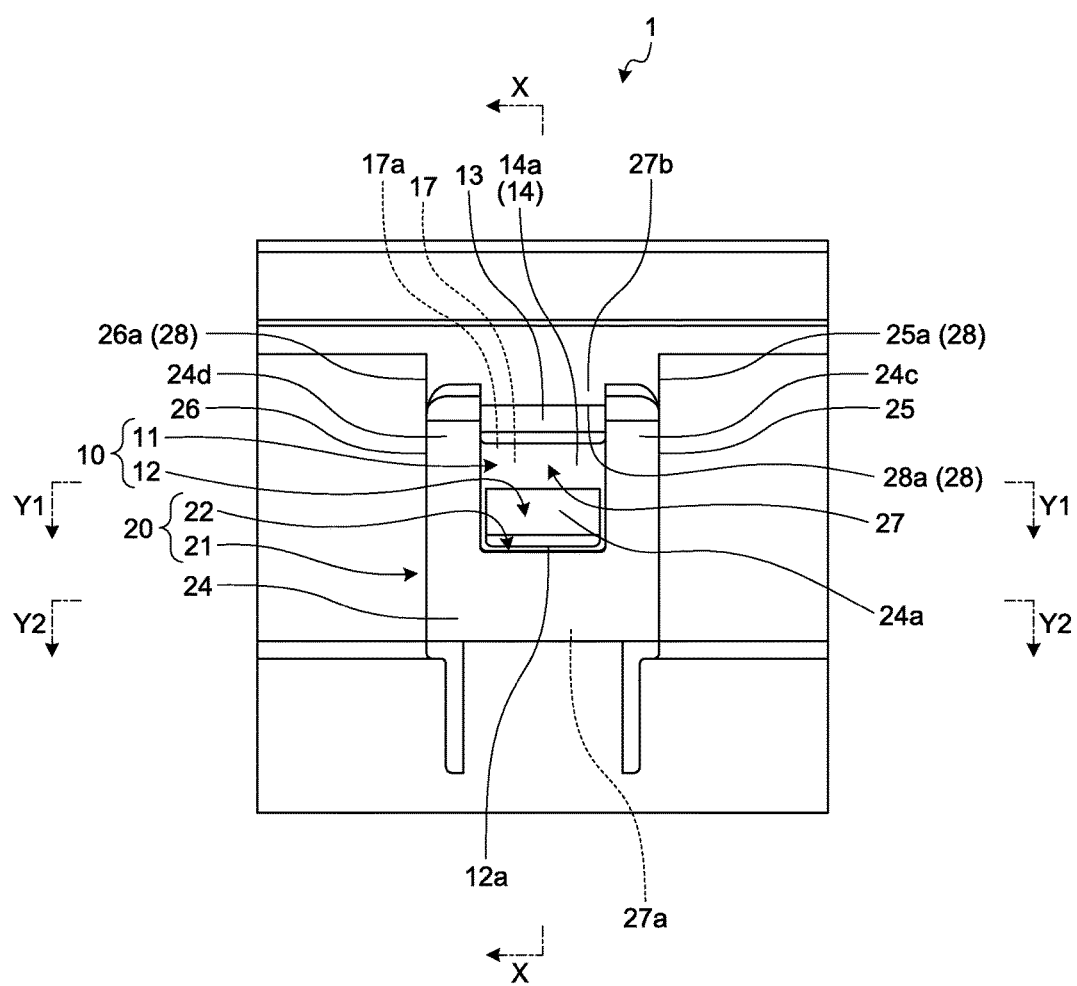
FIG. 4 is a front view of the lock structure in the embodiment after engagement.

The exemplified engaged main body 11 has first and second wall portions (hereinafter referred to as "first and second engaged walls") 13 and 14 arranged so as to be opposed to each other with a gap therebetween in a direction orthogonal to the inserting and removing directions, and third and fourth wall portions (hereinafter referred to as "third and fourth wall portions to be engaged") 15 and 16 arranged so as to be opposed to each other with a gap therebetween in a direction orthogonal to the inserting and removing directions and to a direction (hereinafter referred to as "width direction") orthogonal to the direction in which the first and second engaged walls 13 and 14 are arranged so as to be opposed to each other (FIG. 1 and FIG. 2). In the following, when "opposing arrangement direction" is simply referred to, it means the same direction as the direction in which the first and second engaged walls 13 and 14 are arranged so as to be opposed to each other.

The exemplified first and second engaged walls 13 and 14 are formed into a rectangular flat plate shape. In the present exemplification, the second engaged wall 14 is formed such that the length thereof in the inserting and removing directions is shorter than that of the first engaged wall 13. In the present exemplification, the third engaged wall 15 is provided as a coupling wall portion that connects end portions of the first engaged wall 13 and the second engaged wall 14 on one side in the width direction, and the fourth engaged wall 16 is provided as a coupling wall portion that connects end portions of the first engaged wall 13 and the second engaged wall 14 on the other side in the width direction. In other words, the exemplified engaged main body 11 is formed into a rectangular cylindrical shape by the first to fourth engaged walls 13 to 16. Thus, the engaged main body 11 has a rectangular parallelepiped space (hereinafter referred to as "drainage space") 17 surrounded by inner wall surfaces of the first to fourth engaged walls 13 to 16 (FIG. 1 to FIG. 6). In the present exemplification, a region from an end surface of the second engaged wall 14 on the inserting direction side to an end surface thereof on the removing direction side is the drainage space 17.

The exemplified engaged main body 11 has a first communicating port 17a that allows the drainage space 17 to communicate with the outside on the inserting direction side with respect to the engaged protrusion 12, and a second communicating port 17b that allows the drainage space 17 to communicate with the outside on the removing direction side with respect to the first communicating port 17a (FIG. 1, FIG. 2, FIG. 5, and FIG. 6). In the present exemplification, an end portion of the drainage space 17 on the inserting direction side is the first communicating port 17a, and an end portion of the drainage space 17 on the removing direction side is the second communicating port 17b. In other words, in the engaged main body 11, the first communicating port 17a and the second communicating port 17b are arranged so as to be opposed to each other in the inserting and removing directions such that the first communicating port 17a is opened in the inserting direction and the second communicating port 17b is opened in the removing direction. Thus, in the engaged main body 11, a die hole for forming a gap between the first engaged wall 13 and a piece 14c described below can be used to form the drainage space 17. The first communicating port 17a, the second communicating port 17b, and the drainage space 17 contribute to improvement of moldability of the engaged main body 11.

In the engaged body 10, the engaged protrusion 12 protrudes from an outer wall surface 14a of the second engaged wall 14. The exemplified engaged protrusion 12 is formed into a claw shape in which an end surface thereof on the removing direction side is a surface to be locked 12a, and is disposed on the removing direction side of the outer wall surface 14a of the second engaged wall 14 (FIG. 1 to FIG. 6). On the removing direction side of the second engaged wall 14, two cutouts 14b extended in the inserting direction from an end surface of the second engaged wall 14 on the removing direction side are formed with a gap therebetween in the width direction (FIG. 1). Each cutout 14b is used to form the flexible piece 14c (FIG. 1, FIG. 2, FIG. 5, and FIG. 6) on the removing direction side of the second engaged wall 14. The engaged protrusion 12 is provided on the outer wall surface of the piece 14c.

In the engaged body 10, the first, third, and fourth engaged walls 13, 15, and 16 are extended on the removing direction side with respect to the second communicating port 17b.

The engaging body 20 has a main body (hereinafter referred to as "engaging main body") 21 configured to house the engaged body 10 therein, and a locking portion 22 to be arranged so as to be opposed to the surface to be locked 12a of the engaged protrusion 12 in the inserting and removing directions after the engaged body 10 is housed (FIG. 1 to FIG. 6).

The exemplified engaging main body 21 has first and second wall portions (hereinafter referred to as "first and second engaging walls") 23 and 24 arranged so as to be opposed to each other with a gap therebetween in a direction orthogonal to the inserting and removing directions, and third and fourth wall portions (hereinafter referred to as "third and fourth engaging walls") 25 and 26 arranged so as to be opposed to each other with a gap therebetween in a direction (hereinafter referred to as "width direction") orthogonal to the inserting and removing directions and to the direction in which the first and second engaging walls 23 and 24 are arranged so as to be opposed to each other (FIG. 1 and FIG. 2).

The exemplified first and second engaging walls 23 and 24 are formed into a rectangular flat plate shape. In the present exemplification, the third engaging wall 25 is provided as a coupling wall portion that connects end portions of the first engaging wall 23 and the second engaging wall 24 on one side in the width direction, and the fourth engaging wall 26 is provided as a coupling wall portion that connects end portions of the first engaging wall 23 and the second engaging wall 24 on the other side in the width direction. In other words, the exemplified engaging main body 21 is formed into a rectangular cylindrical shape by the first to fourth engaging walls 23 to 26. Thus, the engaging main body 21 has a rectangular parallelepiped internal space surrounded by inner wall surfaces of the first to fourth engaging walls 23 to 26. The internal space is used as a housing space 27 in which the engaged main body 11 of the engaged body 10 is housed (FIG. 1 to FIG. 6). For example, in the lock structure 1, the engaged main body 11 is locked to the inner wall surface of the housing space 27 in the inserting direction, thereby regulate the insertion amount of the engaged main body 11 into the housing space 27.

The exemplified engaging main body 21 has an insertion port 27a through which the engaged main body 11 of the engaged body 10 is inserted into the housing space 27 from a distal end 11$a_1$ of an end portion 11a on the inserting direction side (FIG. 1, FIG. 2, FIG. 5, and FIG. 6). Furthermore, the exemplified engaging main body 21 has a communicating port 27b that allows the housing space 27 to communicate with the outside on the inserting direction side with respect to the insertion port 27a (FIG. 1 to FIG. 6). In the present exemplification, an end portion of the housing space 27 on the removing direction side is the insertion port 27a, and an end portion of the housing space 27 on the inserting direction side is the communicating port 27b. In other words, in the engaging main body 21, the insertion port 27a and the communicating port 27b are arranged so as to be opposed to each other in the inserting and removing directions such that the insertion port 27a is opened in the removing direction and the communicating port 27b is opened in the inserting direction.

The exemplified engaging main body 21 has a locking hole 24a which is a through hole provided in the second engaging wall 24 and through which the engaged protrusion 12 is inserted when the engaged main body 11 of the engaged body 10 is housed in the housing space 27 (FIG. 1 to FIG. 6). The locking hole 24a has at least a peripheral wall surface disposed on the removing direction side. The peripheral wall surface of the locking hole 24a on the removing direction side is a locking surface for locking the surface to be locked 12a of the engaged protrusion 12 in the inserting and removing directions after the engaged protrusion 12 is inserted into the locking hole 24a, and is used as the locking portion 22. Thus, the peripheral wall surface of the locking hole 24a on the removing direction side is formed at a position opposed to the surface to be locked 12a of the inserted engaged protrusion 12 in the inserting and removing directions. The peripheral wall surface of the locking hole 24a on the removing direction side is formed at a position and with a shape that can lock the surface to be locked 12a of the inserted engaged protrusion 12 on the removing direction side so as to restrict the relative motion of the engaged main body 11 of the engaged body 10 in the removing direction with respect to the engaging main body 21 of the engaging body 20. In the present exemplification, the locking hole 24a is formed to be rectangular, and a peripheral wall surface on one side of the locking hole 24a on the removing direction side is used as the locking portion 22.

In the engaging main body 21, the communicating port 27b is disposed on the inserting direction side with respect to the locking hole 24a. For example, a part of the second engaging wall 24 may be interposed between the locking hole 24a and the communicating port 27b such that the locking hole 24a and the communicating port 27b are formed as an individual through hole and an individual opening, or the locking hole 24a and the communicating port 27b may be formed without interposing a part of the second engaging wall 24 therebetween. The exemplified locking hole 24a is extended up to an end surface of the second engaging wall 24 on the inserting direction side so as to be formed as a through hole continuous to the communicating port 27b.

In the lock structure 1, a minute gap is provided between wall surfaces arranged so as to be opposed to each other between the engaged body 10 and the engaging body 20 in order to insert and remove the engaged body 10 and the engaging body 20. Thus, when a gap connecting to the inside of the housing 110 as described later is present, it is desired that the lock structure 1 be configured such that liquid such as water is prevented from intruding into the inside of the housing 110 from the gap.

For example, in the lock structure 1 in the present embodiment, when the engaged main body 11 of the engaged body 10 is housed in the engaging main body 21 of the engaging body 20, the first communicating port 17a of the engaged main body 11 and the communicating port 27b of the engaging main body 21 are connected to each other through the housing space 27 therebetween. Furthermore, in the lock structure 1, when the engaged main body 11 is housed, the locking hole 24a of the engaging main body 21 is also connected to the first communicating port 17a through the housing space 27. Thus, when the lock structure 1 is installed in a state in which liquid may intrude into the housing space 27 from the communicating port 27b or the locking hole 24a, such as a state in which the first communicating port 17a or the communicating port 27b faces upward, the following effects are obtained.

Figure 7:
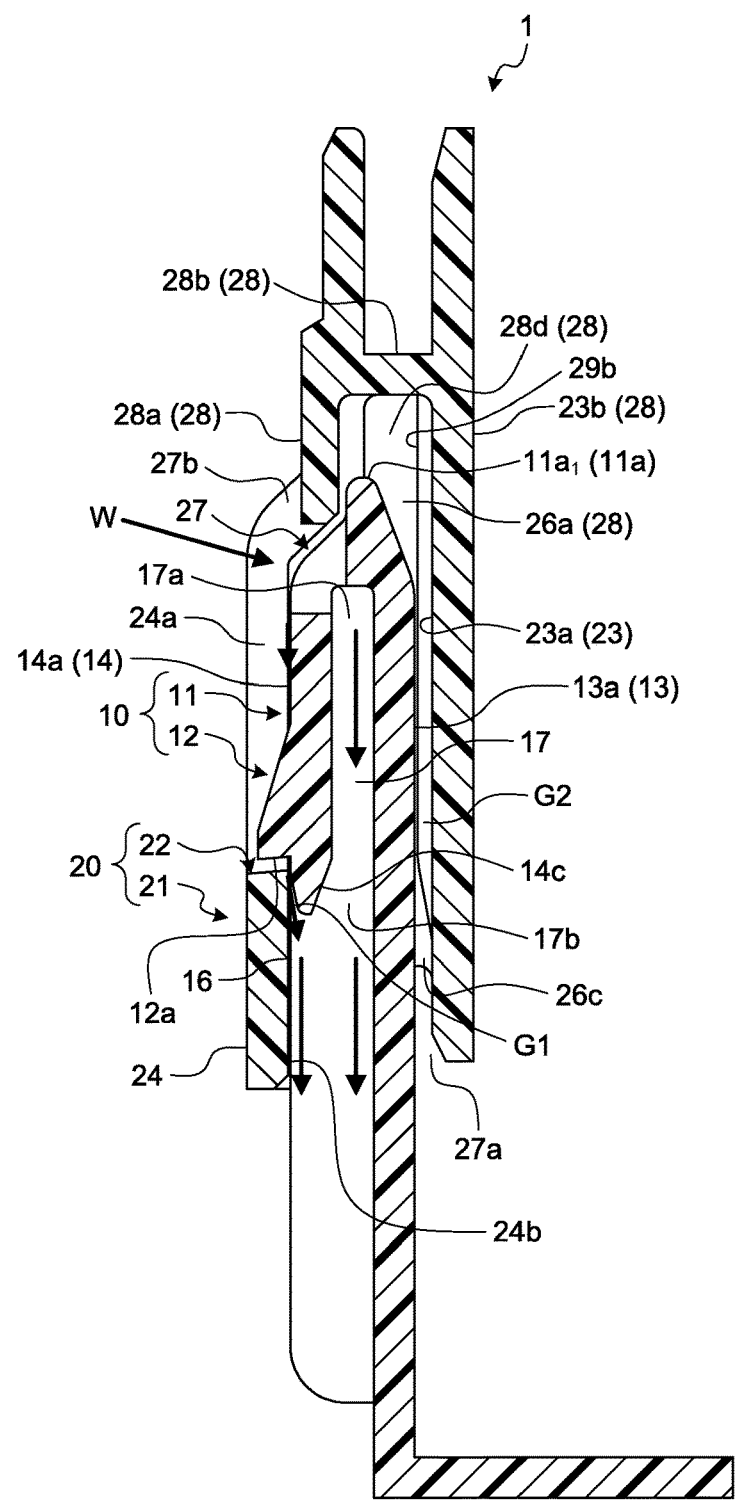
FIG. 7 is a diagram for describing an example of a path of liquid.

In the lock structure 1 in this installation state, even when liquid W intrudes into the housing space 27 from the communicating port 27b or the locking hole 24a and the intruding liquid W is guided to the end portion 11a of the engaged main body 11 on the inserting direction side, the liquid W can be guided into the drainage space 17 from the first communicating port 17a and discharged to the outside from the second communicating port 17b (FIG. 7). In particular, in the exemplified lock structure 1, the first communicating port 17a is arranged at a position linearly to the communicating port 27b and the locking hole 24a, and hence the liquid W that has intruded into the housing space 27 from the communicating port 27b or the locking hole 24a can be directly and easily guided into the drainage space 17 from the first communicating port 17a. In this manner, the lock structure 1 in the present embodiment is provided with the drainage space 17 as a discharge space for the liquid W, and hence the liquid W that has intruded between the engaged body 10 and the engaging body 20 can be discharged to the outside from the drainage space 17. Thus, the lock structure 1 can suppress the intrusion of the liquid W into a gap between the engaged body 10 and the engaging body 20 that is connected to the inside of the housing 110.

In the lock structure 1 in this installation state, when liquid W has intruded into the housing space 27 from the communicating port 27b or the locking hole 24a, the liquid W can be discharged to the outside from a gap G1 between the outer wall surface 14a of the second engaged wall 14 of the engaged main body 11 and an inner wall surface 24b of the second engaging wall 24 of the engaging main body 21 (FIG. 7). Thus, also from this viewpoint, the lock structure 1 can suppress the intrusion of the liquid W into the gap between the engaged body 10 and the engaging body 20 that is connected to the inside of the housing 110.

Figure 8:
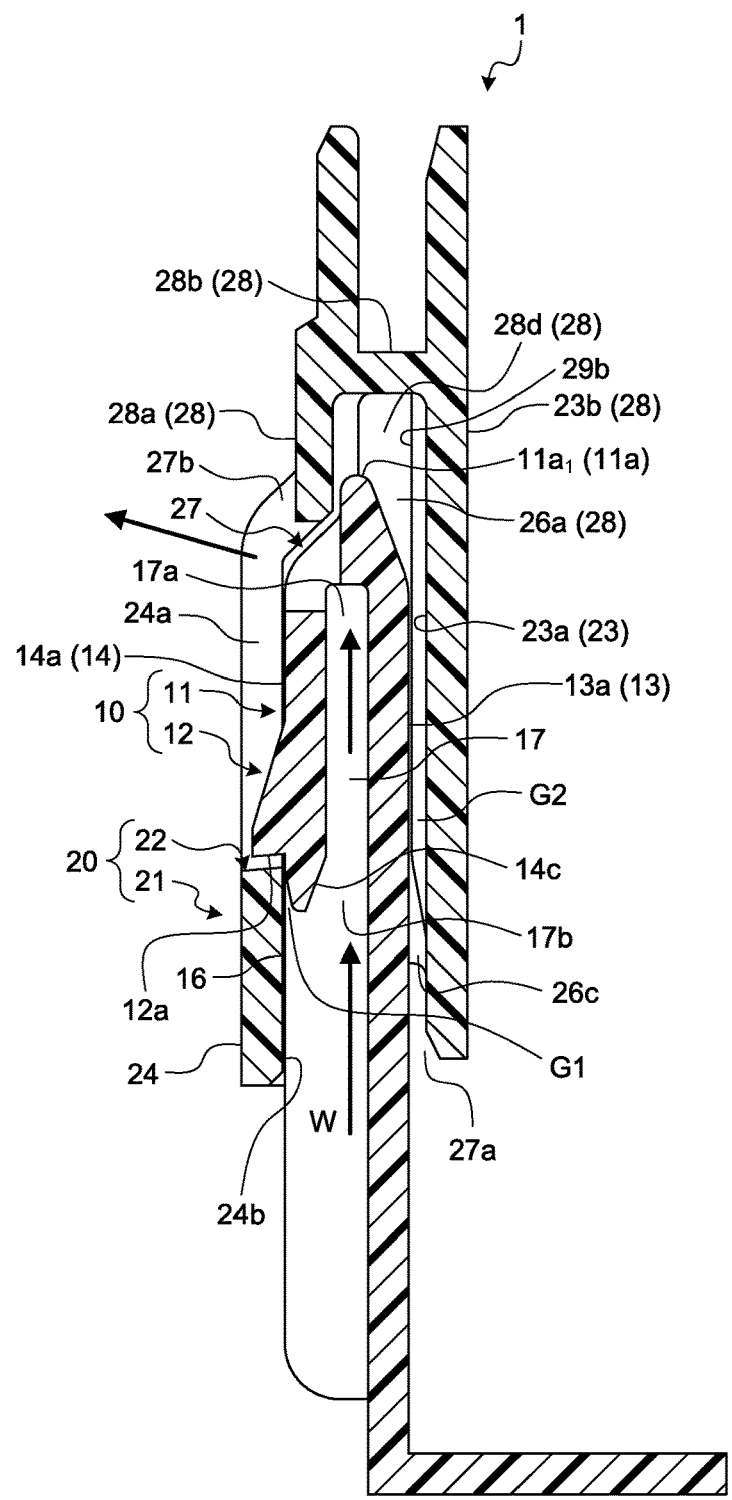
FIG. 8 is a diagram for describing an example of a path of liquid.

In the lock structure 1 in this installation state, when liquid W having high intrusion speed has intruded from the insertion port 27a side, the liquid W can be guided into the drainage space 17 from the second communicating port 17b and discharged to the outside from the first communicating port 17a (FIG. 8). Thus, in the lock structure 1 in the present embodiment, even in the installation state in which liquid W may intrude from the second communicating port 17b, such as a state in which the second communicating port 17b faces upward, the liquid W can be discharged to the outside from the first communicating port 17a. Thus, also from this viewpoint, the lock structure 1 can suppress the intrusion of the liquid W into the gap between the engaged body 10 and the engaging body 20 that is connected to the inside of the housing 110.

Figure 6:
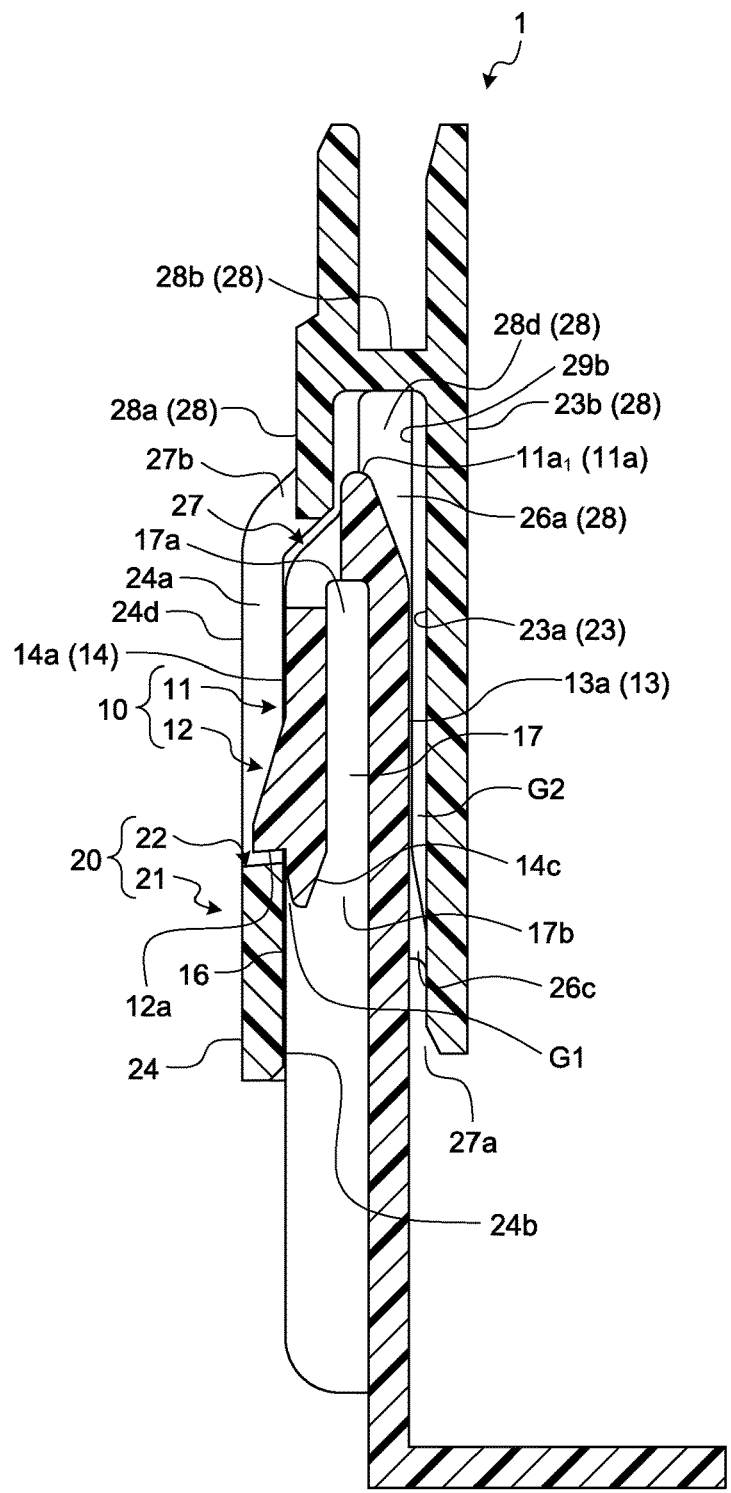
FIG. 6 is a cross-sectional view taken along the line X-X in FIG. 4.

In the lock structure 1, when liquid that has not been discharged to the outside climbs over the distal end $11a_1$ of the end portion 11a of the engaged main body 11 on the inserting direction side, the liquid may be transferred to a gap G2 between an outer wall surface 13a of the first engaged wall 13 of the engaged main body 11 and an inner wall surface 23a of the first engaging wall 23 of the engaging main body 21 (FIG. 6). For example, when the distal end $11a_1$ of the engaged main body 11 is exposed to the outside, the liquid may intrude linearly toward the distal end 11a. In a specific application example of the lock structure 1 described later, the gap G2 between the outer wall surface 13a of the first engaged wall 13 and the inner wall surface 23a of the first engaging wall 23 is connected to the inside of the housing 110. Thus, in the lock structure 1, the engaging body 20 is formed as described below to suppress the linear intrusion of liquid toward the distal end 11a of the engaged main body 11.

Figure 5:
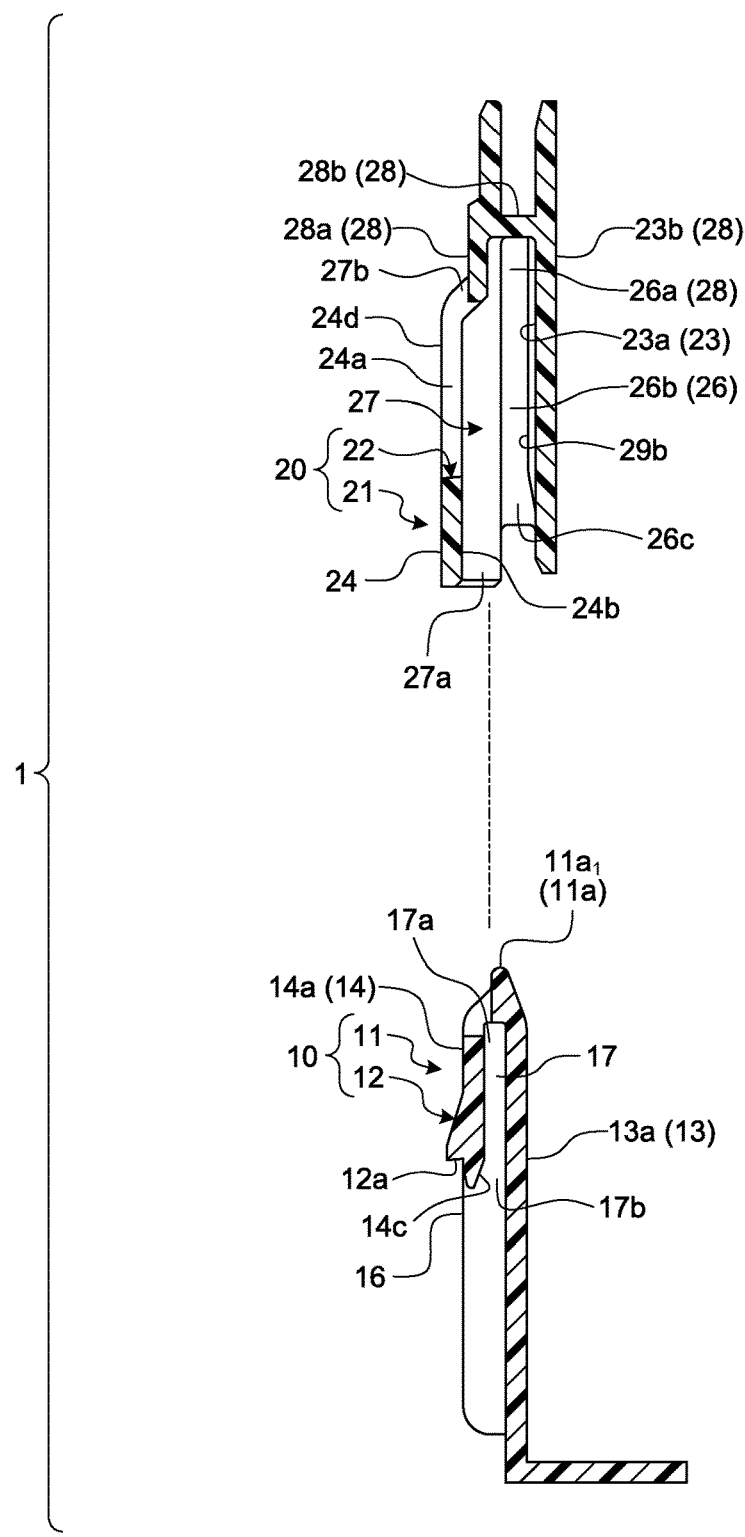
FIG. 5 is a cross-sectional view taken along the line X-X in FIG. 2.

The engaging body 20 has a covering portion 28 that covers the end portion 11a of the engaged main body 11 on the inserting direction side after the engaged main body 11 is housed in the housing space 27 (FIG. 1 to FIG. 6). The exemplified covering portion 28 has an end portion 23b of the first engaging wall 23 on the inserting direction side (FIG. 5 and FIG. 6), a first covering wall portion 28a disposed so as to be opposed to the end portion 23b with a gap therebetween and such that the end portion 11a of the housed engaged main body 11 is interposed between the first covering wall portion 28a and the end portion 23b (FIG. 1 to FIG. 6), an end portion 25a on the inserting direction side of the third engaging wall 25 that connects end portions of the end portion 23b and the first covering wall portion 28a on one side in the width direction (FIG. 1 to FIG. 4), an end portion 26a on the inserting direction side of the fourth engaging wall 26 that connects end portions of the end portion 23b and the first covering wall portion 28a on the other side in the width direction (FIG. 1 to FIG. 6), and a second covering wall portion 28b that closes an opening surrounded by the end portions 23b, 25a, and 26a and a distal end of the first covering wall portion 28a on the inserting direction side (FIG. 5 and FIG. 6). The exemplified first covering wall portion 28a is formed into a rectangular flat plate shape that connects the inserting direction side and the removing direction side starting from the communicating port 27b. The exemplified second covering wall portion 28b is formed into a rectangular flat plate shape, and is disposed so as to be opposed to the distal end $11a_1$ of the engaged main body 11 in the inserting and removing directions.

Figure 9:
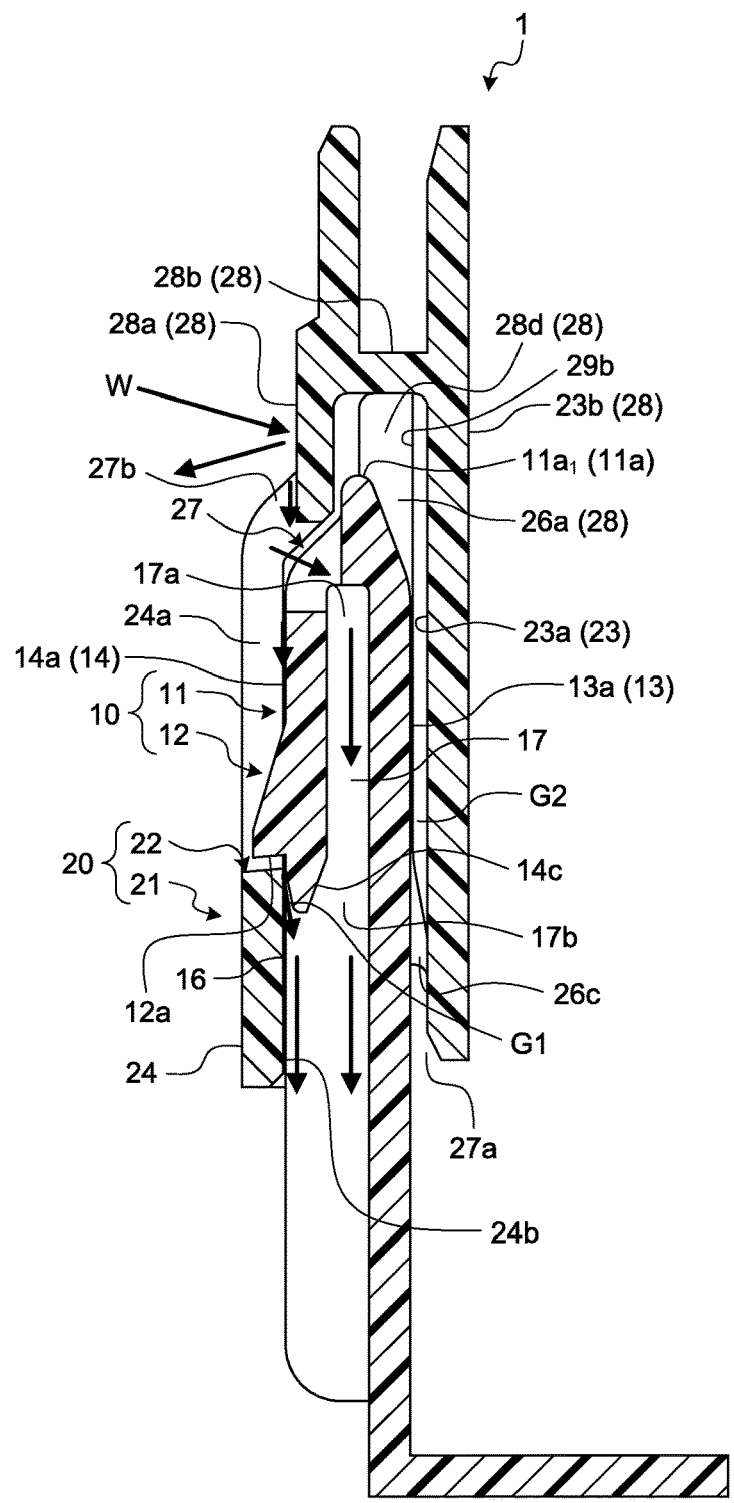
FIG. 9 is a diagram for describing an example of a path of liquid.

In the lock structure 1, the liquid W directed linearly to the distal end 11a of the engaged main body 11 can be stopped by the covering portion 28 (FIG. 9). For example, in the lock structure 1, the liquid W can be stopped by the covering portion 28, and hence the intrusion of the liquid W into the gap G2 between the outer wall surface 13a of the first engaged wall 13 of the engaged main body 11 ahead of the distal end 11a and the inner wall surface 23a of the first engaging wall 23 of the engaging main body 21 can be suppressed. In the lock structure 1, the intrusion of liquid W stopped by the end portion 25a of the third engaging wall 25, the end portion 26a of the fourth engaging wall 26, and the second covering wall portion 28b into a region between the engaged body 10 and the engaging body 20 can be suppressed. In the lock structure 1, the first covering wall portion 28a of the covering portion 28 is arranged on the inserting direction side with respect to the first communicating port 17a, and hence even when the liquid W stopped by the first covering wall portion 28a intrudes into the housing space 27, the liquid W can be discharged to the outside from the gap G1 between the outer wall surface 14a of the second engaged wall 14 and the inner wall surface 24b of the second engaging wall 24 and from the drainage space 17 (FIG. 9). Thus, the lock structure 1 can suppress the intrusion of liquid W into the gap between the engaged body 10 and the engaging body 20 that is connected to the inside of the housing 110.

Figure 10:
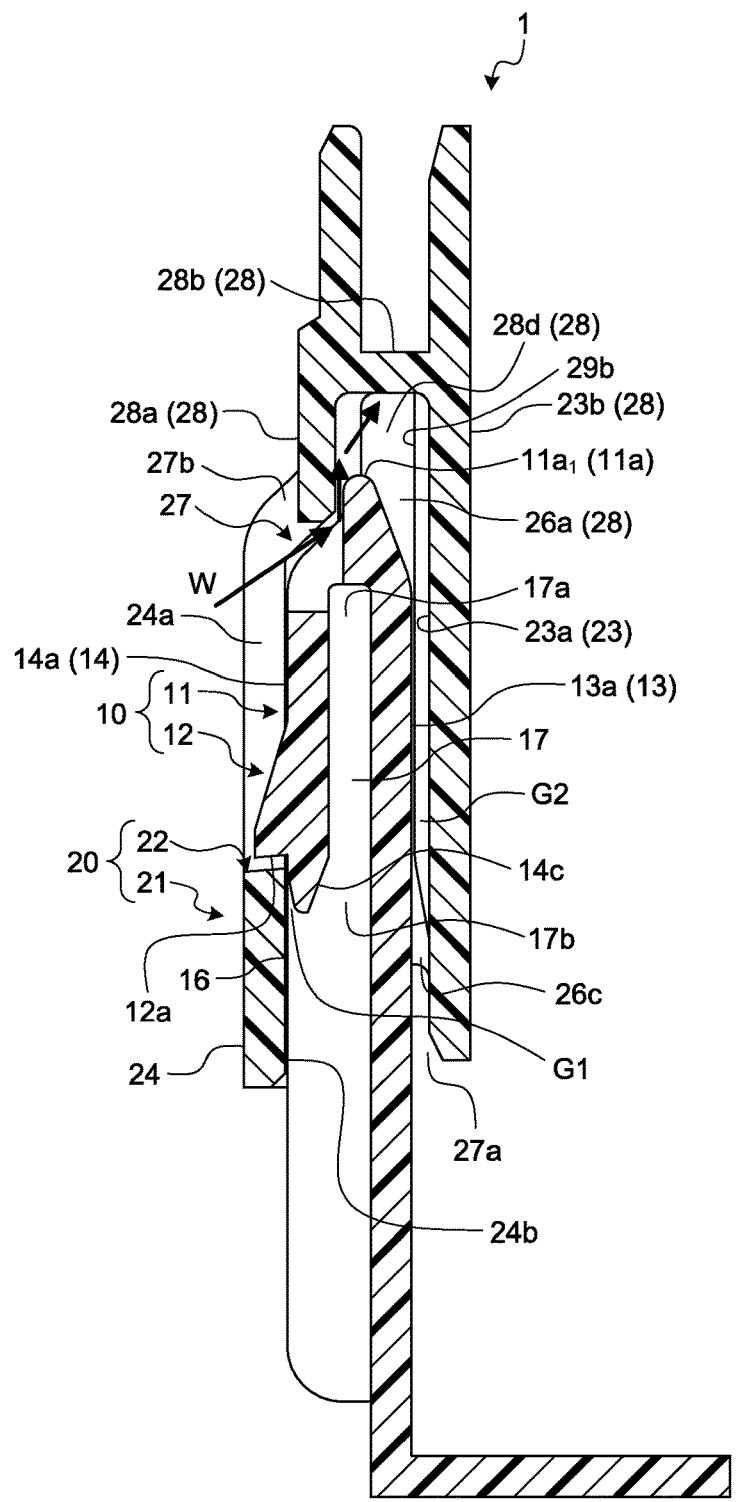
FIG. 10 is a diagram for describing an example of a path of liquid.

It is desired that the covering portion 28 have a space 28d on the inserting direction side with respect to the distal end 11a of the engaged main body 11 after being inserted in the housing space 27 (FIG. 6). In the lock structure 1, even when the intrusion speed of liquid W that has intruded into the housing space 27 from the locking hole 24a is high and the liquid W is guided to the distal end 11a of the engaged main body 11 through the inner wall surface of the first engaged wall 13 on the inserting direction side with respect to the first communicating port 17a, the momentum of the liquid W that has climbed over the distal end 11a of the engaged main body 11 can be suppressed by the space 28d (FIG. 10). Thus, the space 28d has a shape and a volume capable of reducing the speed of the liquid W and suppressing the momentum of the liquid W when the liquid W has climbed over the distal end 11a of the engaged main body 11. Thus, in the lock structure 1, even when the liquid W intrudes from the space 28d into the gap G2 between the outer wall surface 13a of the first engaged wall 13 and the inner wall surface 23a of the first engaging wall 23, the intrusion amount of the liquid W can be reduced. Consequently, the lock structure 1 can suppress the intrusion of liquid W into the inside of the housing 110.

Figure 11:
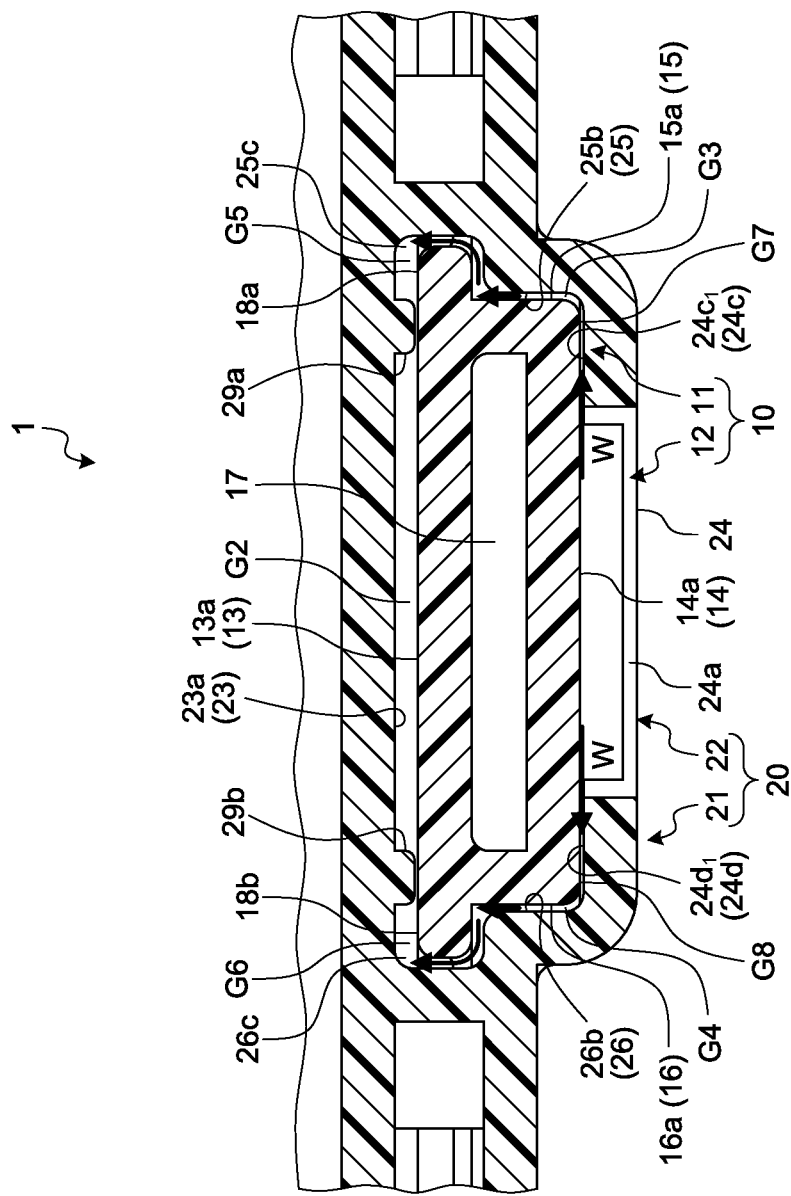
FIG. 11 is a cross-sectional view taken along the line Y1-Y1 in FIG. 4, for describing an example of a path of liquid.

In the lock structure 1, the covering portion 28 can suppress the intrusion of liquid W into a gap G3 between an outer wall surface 15a of the third engaged wall 15 and an inner wall surface 25b of the third engaging wall 25 (FIG. 11) and suppress the intrusion of liquid W into a gap G4 between an outer wall surface 16a of the fourth engaged wall 16 and an inner wall surface 26b of the fourth engaging wall 26 (FIG. 11).

Furthermore, it is desired that the lock structure 1 be provided with the following labyrinth structure so as to reduce the intrusion amount of liquid into a gap between the engaged body 10 and the engaging body 20 that is connected to the inside of the housing 110.

The engaged body 10 has a first protruding wall 18a that protrudes from the outer wall surface 15a of the third engaged wall 15 while intersecting the outer wall surface 15a and extends in the inserting and removing directions, and a second protruding wall 18b that protrudes from the outer wall surface 16a of the fourth engaged wall 16 while intersecting the outer wall surface 16a and extends in the inserting and removing directions (FIG. 2 and FIG. 11). The exemplified first protruding wall 18a protrudes from the outer wall surface 15a of the third engaged wall 15 on the first engaging wall 23 side in the direction orthogonal to the outer wall surface 15a. The exemplified second protruding wall 18b protrudes from the outer wall surface 16a of the fourth engaged wall 16 on the first engaging wall 23 side in the direction orthogonal to the outer wall surface 16a. The first protruding wall 18a and the second protruding wall 18b protrude in opposite directions in the width direction on the same plane as the first engaged wall 13.

The third engaging wall 25 of the engaging main body 21 has a groove portion 25c configured to house the first protruding wall 18a of the engaged body 10 therein (FIG. 11). The fourth engaging wall 26 of the engaging main body 21 has a groove portion 26c configured to house the second protruding wall 18b of the engaged body 10 therein (FIG. 5 and FIG. 11). The exemplified groove portion 25c is provided in the inner wall surface 25b of the third engaging wall 25. The exemplified groove portion 26c is provided in the inner wall surface 26b of the fourth engaging wall 26.

In the lock structure 1, a gap G5 is formed between the first protruding wall 18a and the groove portion 25c (FIG. 11). The gap G3 between the outer wall surface 15a of the third engaged wall 15 and the inner wall surface 25b of the third engaging wall 25 is connected to the gap G2 between the outer wall surface 13a of the first engaged wall 13 and the inner wall surface 23a of the first engaging wall 23 through the gap G5 (FIG. 11). Thus, in the lock structure 1, a labyrinth structure is formed by the gaps G3 and G5, and hence the intrusion of liquid W into the gap G2 can be suppressed. Furthermore, even when the liquid W intrudes into the gap G3 and reaches the gap G2, the liquid W that has intruded into the gap G3 reaches the gap G2 through the gap G5, and hence the amount of the liquid W reaching the gap G2 can be reduced. In the exemplified lock structure 1, one end of the gap G2 in the width direction is shared as a part of the gap G5.

In the lock structure 1, a gap G6 is formed between the second protruding wall 18b and the groove portion 26c (FIG. 11). The gap G4 between the outer wall surface 16a of the fourth engaged wall 16 and the inner wall surface 26b of the fourth engaging wall 26 is connected to the gap G2 through the gap G6 (FIG. 11). Thus, in the lock structure 1, a labyrinth structure is formed by the gaps G4 and G6, and hence the intrusion of liquid W into the gap G2 can be suppressed. Furthermore, even when the liquid W intrudes into the gap G4 and reaches the gap G2, the liquid W that has intruded into the gap G4 reaches the gap G2 through the gap G6, and hence the amount of the liquid W reaching the gap G2 can be reduced. In the exemplified lock structure 1, the other end of the gap G2 in the width direction is shared as a part of the gap G6.

The lock structure 1 can suppress the intrusion of liquid W into the inside of the housing 110 owing to such a labyrinth structure.

In the lock structure 1, a combination of the first protruding wall 18a and the groove portion 25c and a combination of the second protruding wall 18b and the groove portion 26c function as guide mechanisms for inserting the engaged main body 11 into the housing space 27.

The second engaging wall 24 of the engaging main body 21 has one edge 24c in the width direction of the locking hole 24a and another edge 24d in the width direction of the locking hole 24a (FIG. 1 to FIG. 4 and FIG. 11). One edge 24c is a site on the second engaging wall 24 that is continuous to the third engaging wall 25, and is arranged so as to be orthogonal to the third engaging wall 25. An inner wall surface $24c_1$ of one edge 24c is arranged so as to be opposed to one end of the outer wall surface 14a of the second engaged wall 14 in the width direction (FIG. 11). Specifically, in the exemplified lock structure 1, the gap G3 is connected to the outside through a gap G7 between one end of the outer wall surface 14a of the second engaged wall 14 in the width direction and the inner wall surface $24c_1$ of one edge 24c. Thus, in the lock structure 1, a labyrinth structure is formed by the gaps G7, G3, and G5, and hence the intrusion of liquid W into the gap G2 can be further suppressed, and even when the liquid reaches the gap G2, the liquid reaches the gap G2 through the gaps G7, G3, and G5, and the amount of the liquid reaching the gap G2 can be further reduced. The other edge 24d is a site on the second engaging wall 24 that is continuous to the fourth engaging wall 26, and is arranged so as to be orthogonal to the fourth engaging wall 26. An inner wall surface $24d_1$ of the other edge 24d is arranged so as to be opposed to the other end of the outer wall surface 14a of the second engaged wall 14 in the width direction (FIG. 11). Specifically, in the exemplified lock structure 1, the gap G4 is connected to the outside through a gap G8 between the other end of the outer wall surface 14a of the second engaged wall 14 in the width direction and the inner wall surface $24d_1$ of the other edge 24d. Thus, in the lock structure 1, a labyrinth structure is formed by the gaps G8, G4, and G6, and hence the intrusion of liquid W into the gap G2 can be further suppressed, and even when the liquid reaches the gap G2, the liquid reaches the gap G2 through the gaps G8, G4, and G6, and the amount of the liquid reaching the gap G2 can be further reduced. In this manner, the exemplified lock structure 1 can further suppress the intrusion of the liquid W into the inside of the housing 110.

The lock structure 1 has the following labyrinth structures.

Figure 12:
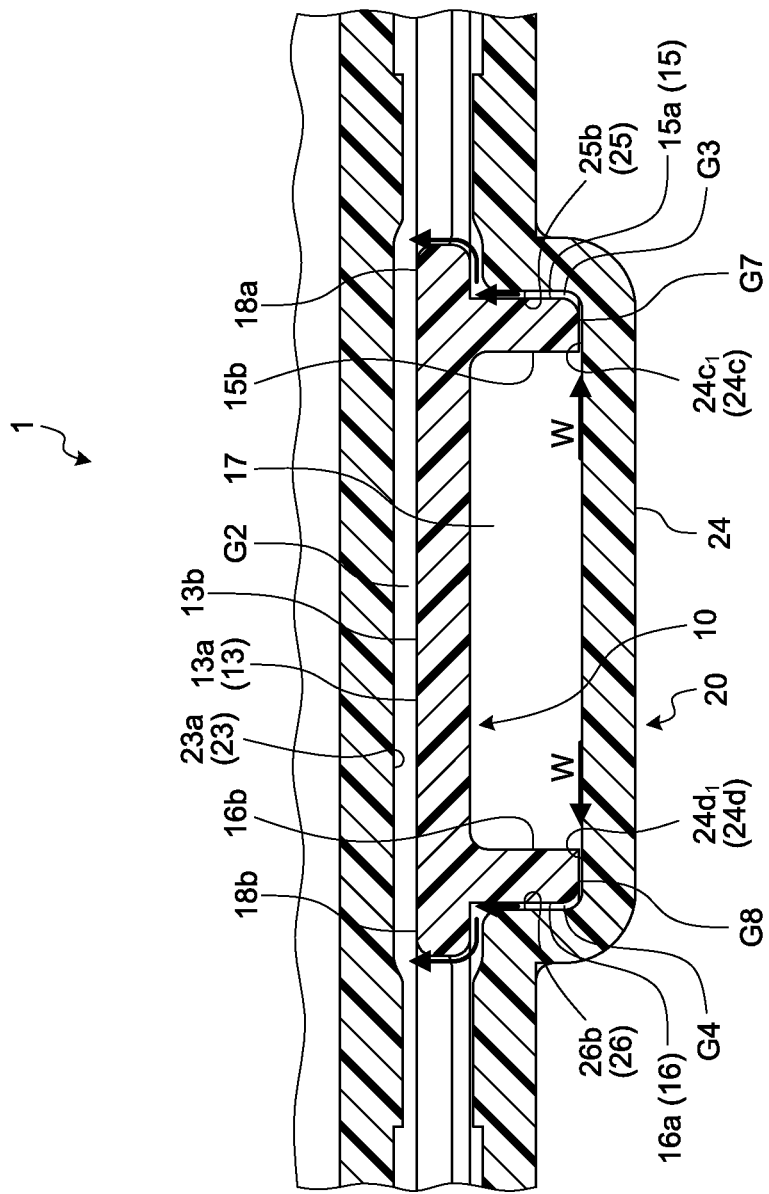
FIG. 12 is a cross-sectional view taken along the line Y2-Y2 in FIG. 4, for describing an example of a path of liquid.

The engaged body 10 has a first extending wall 13b that protrudes and extends from the engaged main body 11 in the removing direction and is arranged so as to be opposed to the inner wall surface 23a of the first engaging wall 23 after the engaged main body 11 is housed in the housing space 27 (FIG. 12). In the present exemplification, the first engaged wall 13 is extended in the removing direction, and the extended part is used as the first extending wall 13b. Thus, in the exemplified lock structure 1, the gap G2 between the outer wall surface 13a of the first engaged wall 13 and the inner wall surface 23a of the first engaging wall 23 is connected to the first extending wall 13b.

The engaged body 10 has a second extending wall 15b that protrudes and extends from the engaged main body 11 in the removing direction and is arranged so as to be opposed to the inner wall surface 25b of the third engaging wall 25 after the engaged main body 11 is housed in the housing space 27 (FIG. 12). The second extending wall 15b is provided on the inner wall surface of the first extending wall 13b as a rib. In the present exemplification, the third engaged wall 15 is extended in the removing direction, and the extended part is used as the second extending wall 15b. Thus, in the exemplified lock structure 1, the gap G3 between the outer wall surface 15a of the third engaged wall 15 and the inner wall surface 25b of the third engaging wall 25 is connected to the second extending wall 15b.

Furthermore, the second extending wall 15b is vertically provided from the inner wall surface of the first extending wall 13b up to the position of the outer wall surface 14a of the second engaged wall 14, and an end surface thereof in the vertical direction is arranged so as to be opposed to an inner wall surface $24c_1$ of one edge 24c of the second engaging wall 24. Thus, in the exemplified lock structure 1, the gap G7 between one end of the outer wall surface 14a of the second engaged wall 14 in the width direction and the inner wall surface $24c_1$ of one edge 24c is connected to the second extending wall 15b.

In the lock structure 1, a labyrinth structure is formed by the gaps G3 and G7 in the second extending wall 15b, and hence the intrusion of liquid W into the gap G2 can be suppressed.

The exemplified first protruding wall 18a is extended to the second extending wall 15b in the inserting and removing directions (FIG. 12). Thus, the liquid W that has intruded into the gap G3 in the second extending wall 15b needs to climb over the first protruding wall 18a before reaching the gap G2. Specifically, in the lock structure 1, the creeping distance is increased by the first protruding wall 18a extended to the second extending wall 15b, and hence even when the liquid W has intruded into the gap G3 in the second extending wall 15b and reached the gap G2, the amount of the liquid W reaching the gap G2 can be reduced. In the lock structure 1, the groove portion 25c may be extended such that the first protruding wall 18a at the position of the second extending wall 15b can be housed.

The engaged body 10 has a third extending wall 16b that protrudes and extends from the engaged main body 11 in the removing direction and is arranged so as to be opposed to the inner wall surface 26b of the fourth engaging wall 26 after the engaged main body 11 is housed in the housing space 27 (FIG. 12). The third extending wall 16b is vertically provided on the inner wall surface of the first extending wall 13b as a rib. In the present exemplification, the fourth engaged wall 16 is extended in the removing direction, and the extended part is used as the third extending wall 16b. Thus, in the exemplified lock structure 1, the gap G4 between the outer wall surface 16a of the fourth engaged wall 16 and the inner wall surface 26b of the fourth engaging wall 26 is connected to the third extending wall 16b.

Furthermore, the third extending wall 16b is vertically provided from the inner wall surface of the first extending wall 13b up to the position of the outer wall surface 14a of the second engaged wall 14, and an end surface thereof on the vertical direction is arranged so as to be opposed to an inner wall surface $24d_1$ of the other edge 24d of the second engaging wall 24. Thus, in the exemplified lock structure 1, the gap G8 between the other end of the outer wall surface 14a of the second engaged wall 14 in the width direction and the inner wall surface $24d_1$ of the other edge 24d is connected to the third extending wall 16b.

In the lock structure 1, a labyrinth structure is formed by the gaps G4 and G8 in the third extending wall 16b, and hence the intrusion of liquid W into the gap G2 can be suppressed.

In this case, the exemplified second protruding wall 18b is extended to the third extending wall 16b in the inserting and removing directions (FIG. 12). Thus, the liquid W that has intruded into the gap G4 in the third extending wall 16b needs to climb over the second protruding wall 18b before reaching the gap G2. Specifically, in the lock structure 1, the creeping distance is increased by the second protruding wall 18b extended to the third extending wall 16b, and hence even when the liquid W has intruded into the gap G4 in the third extending wall 16b and reached the gap G2, the amount of the liquid W reaching the gap G2 can be reduced. In the lock structure 1, the groove portion 26c may be extended such that the second protruding wall 18b at the position of the third extending wall 16b can be housed.

Furthermore, in the exemplified engaging main body 21, at one end of the inner wall surface 23a of the first engaging wall 23 in the width direction, a rib-shaped protruding portion 29a that protrudes from the inner wall surface 23a toward the outer wall surface 13a of the first engaged wall 13 and is extended in the inserting and removing directions is provided (FIG. 11). In the exemplified engaging main body 21, at the other end of the inner wall surface 23a of the first engaging wall 23 in the width direction, a rib-shaped protruding portion 29b that protrudes from the inner wall surface 23a toward the outer wall surface 13a of the first engaged wall 13 and is extended in the inserting and removing directions is provided (FIG. 5 to FIG. 11). The protruding portions 29a and 29b are formed in substantially the same range as the locking hole 24a in the inserting and removing directions. In this case, the protruding portion 29a is arranged at a boundary portion between the gap G4 and the gap G2, and the protruding portion 29b is arranged at a boundary portion between the gap G6 and the gap G2. Thus, in the lock structure 1, the protruding portions 29a and 29b also serve as a part of the labyrinth structure. Thus, in the lock structure 1, the intrusion of liquid W into the gap G2 can be further suppressed, and even when the liquid reaches the gap G2, the amount of the liquid reaching the gap G2 can be further reduced, and hence the intrusion of the liquid W into the inside of the housing 110 can be further suppressed. The protruding portions 29a and 29b serve as guides for inserting the engaged main body 11 into the housing space 27, and serve to suppress mutual backlash after the engaged main body 11 is housed in the housing space 27.

As described above, the lock structure 1 in the present embodiment can suppress the intrusion of liquid W into the gap between the engaged body 10 and the engaging body 20 that is connected to the inside of the housing 110, and even when the liquid W has intruded into the gap, the lock structure 1 in the present embodiment can suppress the intrusion of the liquid W into the gap G2 directly connected to the inside of the housing 110 and reduce the intrusion amount of the liquid W into the gap G2, and hence can suppress the intrusion of the liquid W into the inside of the housing 110.

For example, the lock structure 1 can be applied to an electric connection box configured to house an electronic component therein and to an electric connection box configured to house an electronic component and an electric wire therein and constituting a wire harness together with the electric wire led to the outside. In this case, a lock structure 1 applied to an electric connection box 100 constituting a wire harness WH (FIG. 13) is described.

Figure 13:
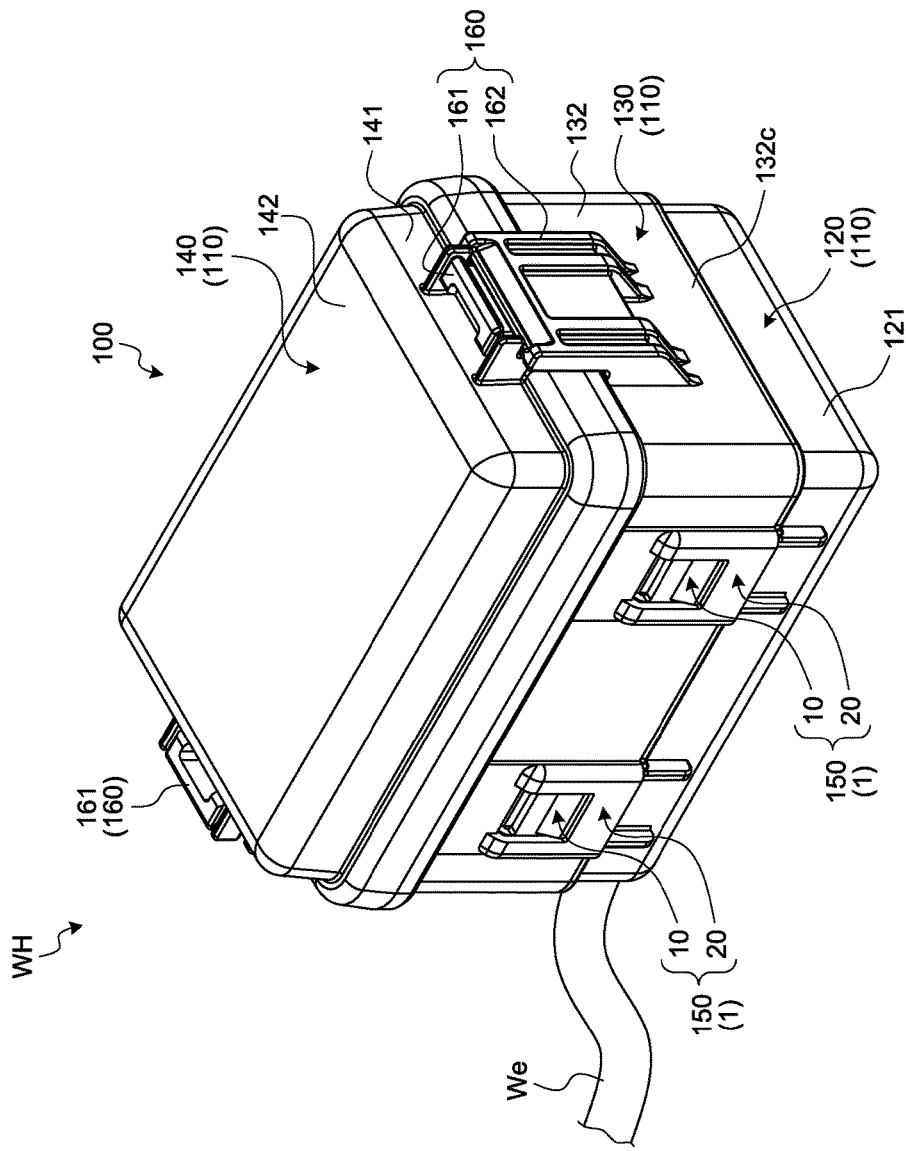
FIG. 13 is a perspective view of an electric connection box and a wire harness to which the lock structure in the embodiment is applied.

The electric connection box 100 includes a housing 110 configured to house an electronic component (not shown) therein. In the exemplified housing 110, an electric wire We electrically connected to the electronic component inside the housing 110 is also housed, and the electric wire We is led to the outside from the inside (FIG. 13). The electric connection box 100 electrically connects an object to be connected (not shown) to the electronic component through the electric wire We. In the electric connection box 100, the electronic component is electrically connected to the object to be connected through the electric wire We led to the outside of the housing 110 from the inside.

Examples of the electronic component include a relay, a circuit protective component such as a fuse, a connector, and a terminal bracket. In this case, a circuit board and an electronic device such as an electronic control unit (what is called ECU) are also regarded as one form of electronic components. Examples of the object to be connected include a power supply such as a secondary battery, a load such as an electric device (such as an actuator), and a sensor. In the electric connection box 100, for example, an electric wire We is electrically connected to a power supply, another electric wire We is electrically connected to a load, and the power supply and the load are electrically connected through an electronic component.

Figure 14:
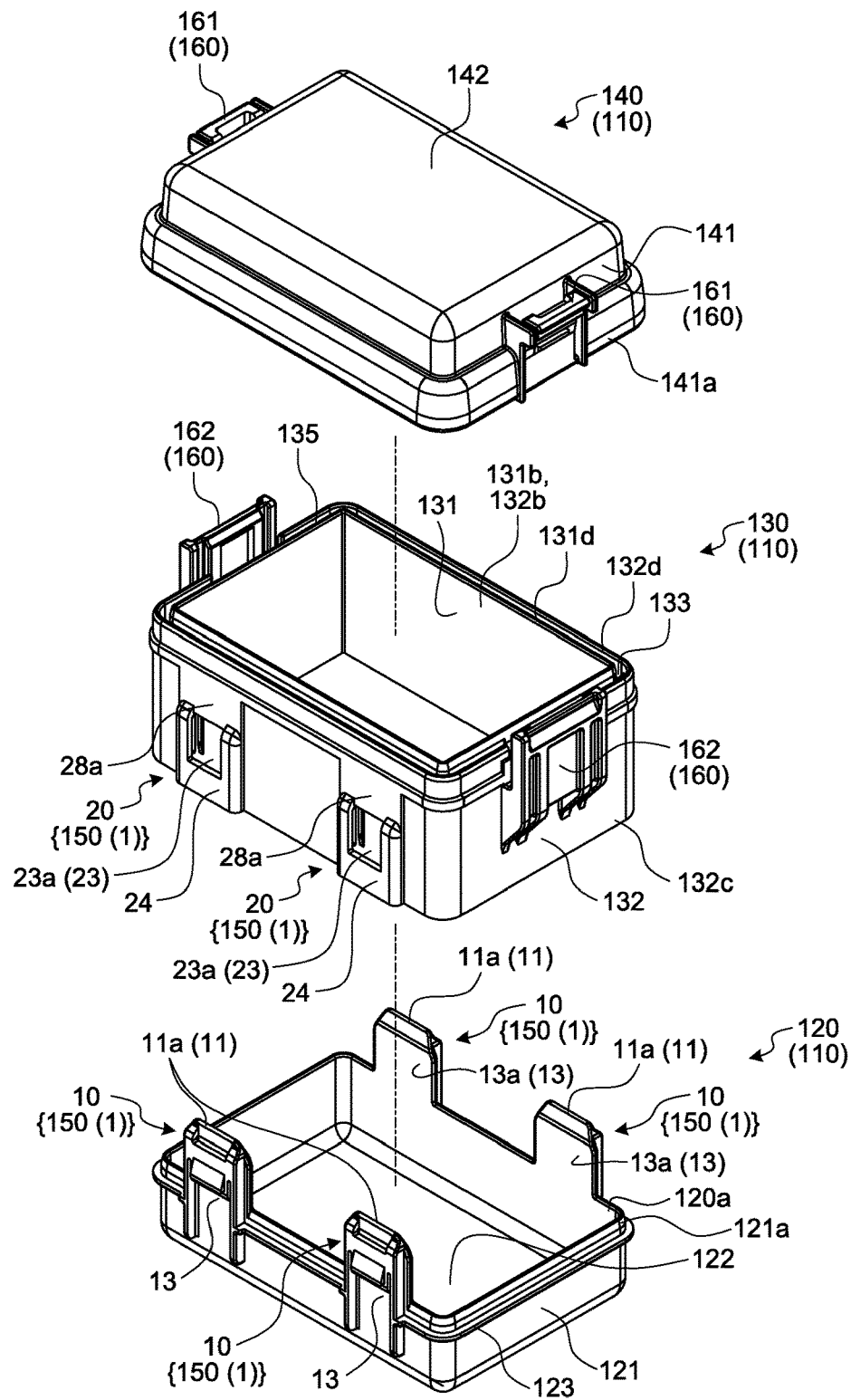
FIG. 14 is an exploded perspective view of a housing in the electric connection box.
Figure 15:
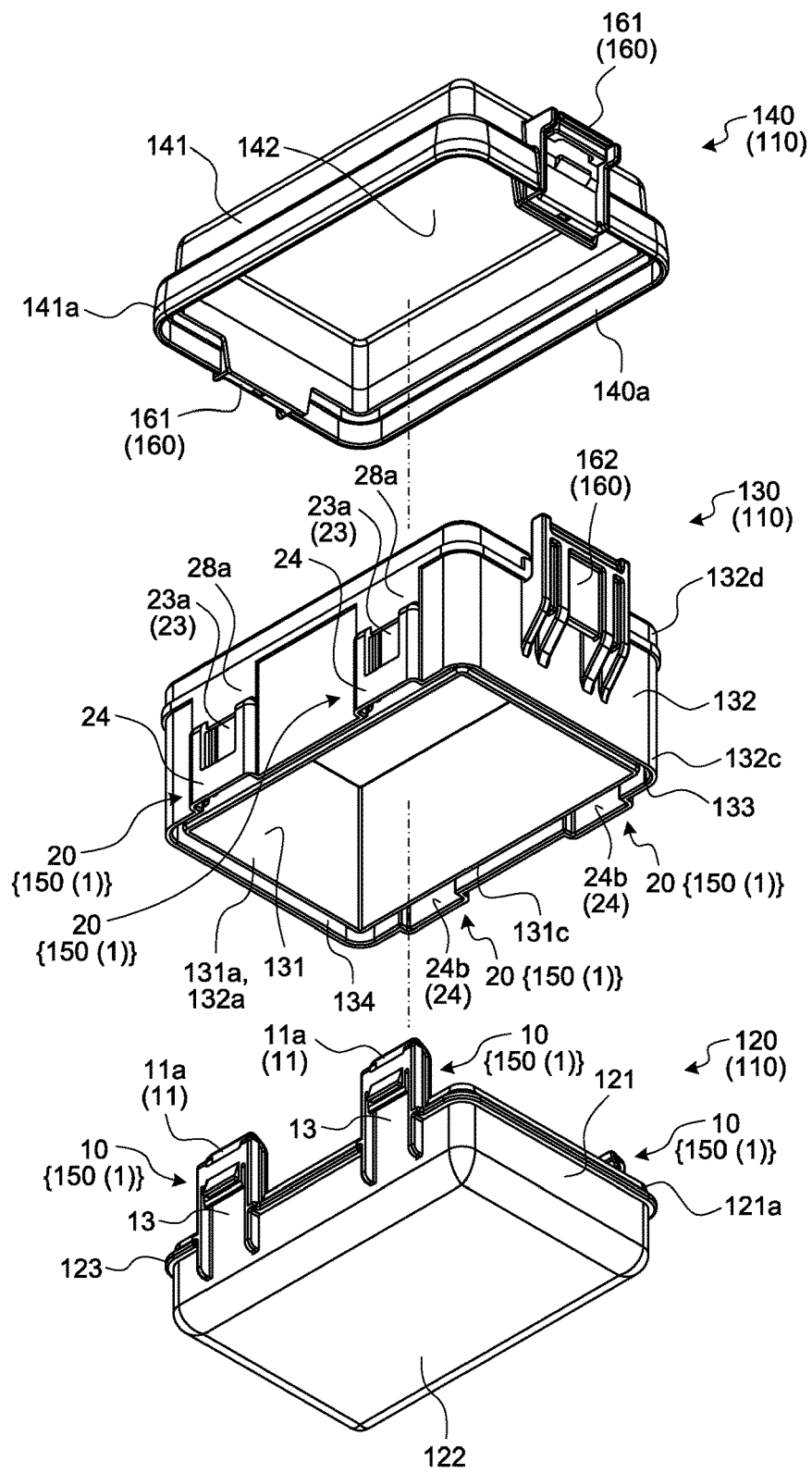
FIG. 15 is an exploded perspective view of the housing in the electric connection box as seen from another angle.

The housing 110 is molded with insulating material, such as synthetic resin. The housing 110 has at least first and second fitting members 120 and 130 to be fitted to each other (FIG. 13 to FIG. 15). The exemplified housing 110 further has a third fitting member 140 (FIG. 13 to FIG. 15). In the housing 110, the first fitting member 120, the second fitting member 130, and the third fitting member 140 are arranged side by side in this order. The housing 110 is formed by fitting the first fitting member 120 and the second fitting member 130 together and fitting the second fitting member 130 and the third fitting member 140 together.

In the exemplified housing 110, the middle second fitting member 130 is formed into a cylindrical shape, one opening in the second fitting member 130 is closed by the first fitting member 120, and the other opening in the second fitting member 130 is closed by the third fitting member 140. The second fitting member 130 serves as a frame as a main body of the housing 110, and the first fitting member 120 and the third fitting member 140 serve as cover members configured to close the openings in the second fitting member 130. For example, the housing 110 is mounted on a vehicle such that two openings in the second fitting member 130 arranged so as to be opposed to each other are oriented in the vehicle vertical direction. Either of the first fitting member 120 and the third fitting member 140 may be a lower cover or an upper cover. In this case, for the sake of convenience, the first fitting member 120 is a lower cover and the third fitting member 140 is an upper cover.

The second fitting member 130 has a cylindrical first peripheral wall body 131 constituting an inner wall and a cylindrical second peripheral wall body 132 constituting an outer wall (FIG. 14 and FIG. 15). The first peripheral wall body 131 and the second peripheral wall body 132 are formed by arranging and connecting the same number of plate-shaped wall bodies in the peripheral direction. The second fitting member 130 has a double wall structure in which the first peripheral wall body 131 and the second peripheral wall body 132 are arranged such that the axial directions thereof are oriented in the same direction, and the first peripheral wall body 131 and the second peripheral wall body 132 are arranged so as to be opposed to each other with a gap therebetween. Thus, in the second fitting member 130, a cylindrical space (hereinafter referred to as "cylindrical space") 133 is formed between the first peripheral wall body 131 and the second peripheral wall body 132 (FIG. 14 and FIG. 15). In the second fitting member 130, one or a plurality of housing chambers are formed inside the first peripheral wall body 131, and the electronic component and the electric wire We are housed in the housing chamber.

The first peripheral wall body 131 has two openings 131a and 131b disposed so as to be opposed to each other (FIG. 14 and FIG. 15). The second peripheral wall body 132 has two openings 132a and 132b disposed so as to be opposed to each other (FIG. 14 and FIG. 15). In the second fitting member 130, a peripheral edge portion (hereinafter referred to as "opening peripheral edge portion") 131c of one opening 131a in the first peripheral wall body 131 and a peripheral edge portion (hereinafter referred to as "opening peripheral edge portion") 132c of one opening 132a in the second peripheral wall body 132 are disposed so as to be opposed to each other with a gap therebetween (FIG. 15). Thus, in the second fitting member 130, one opening 131a in the first peripheral wall body 131 and a ring-shaped opening 134 between the opening peripheral edge portions 131c and 132c on one side are openings to be closed by the first fitting member 120 (FIG. 15). In the second fitting member 130, an peripheral edge portion (hereinafter referred to as "opening peripheral edge portion") 131d of the other opening 131b in the first peripheral wall body 131 and a peripheral edge portion (hereinafter referred to as "opening peripheral edge portion") 132d of the other opening 132b in the second peripheral wall body 132 are disposed so as to be opposed to each other with a gap therebetween (FIG. 14). Thus, in the second fitting member 130, the other opening 131b in the first peripheral wall body 131 and a ring-shaped opening 135 between the opening peripheral edge portions 131d and 132d on the other side are openings to be closed by the third fitting member 140 (FIG. 14).

The first fitting member 120 has a cylindrical peripheral wall body 121 and a closing body 122 that closes one opening in the peripheral wall body 121 (FIG. 14 and FIG. 15). In this case, the other opening in the peripheral wall body 121 is used as an opening 120a in the first fitting member 120 (FIG. 14). In the peripheral wall body 121, a plurality of flat plate-shaped wall bodies arranged and connected in the circumferential direction are arranged so as to correspond to flat plate-shaped wall bodies in the first peripheral wall body 131 and the second peripheral wall body 132. Thus, in the first fitting member 120, a peripheral edge portion (hereinafter referred to as "opening peripheral edge portion") 121a of the opening 120a in the peripheral wall body 121 (FIG. 14) can be inserted and fitted to the cylindrical space 133 from the opening 134 in the second fitting member 130. When inserted and fitted, the opening peripheral edge portion 121a is sandwiched by one opening peripheral edge portion 131c of the first peripheral wall body 131 and one opening peripheral edge portion 132c of the second peripheral wall body 132 in the second fitting member 130. In the first fitting member 120 and the second fitting member 130 in the fitted state, the inner wall surface of the opening peripheral edge portion 121a of the peripheral wall body 121 and the outer wall surface of one opening peripheral edge portion 131c of the first peripheral wall body 131 are arranged so as to be opposed to each other and the outer wall surface of the opening peripheral edge portion 121a of the peripheral wall body 121 and the inner wall surface of one opening peripheral edge portion 132c of the second peripheral wall body 132 are arranged so as to be opposed to each other.

The third fitting member 140 has a cylindrical peripheral wall body 141 and a closing body 142 that closes one opening in the peripheral wall body 141 (FIG. 14 and FIG. 15). In this case, the other opening in the peripheral wall body 141 is used as an opening 140a in the third fitting member 140 (FIG. 15). In the peripheral wall body 141, a plurality of flat plate-shaped wall bodies arranged and connected in the circumferential direction are arranged so as to correspond to flat plate-shaped wall bodies in the first peripheral wall body 131 and the second peripheral wall body 132. Thus, in the third fitting member 140, a peripheral edge portion (hereinafter referred to as "opening peripheral edge portion") 141a of the opening 140a in the peripheral wall body 141 (FIG. 15) can be inserted and fitted to the cylindrical space 133 from the opening 135 in the second fitting member 130. When inserted and fitted, the opening peripheral edge portion 141a is sandwiched by the other opening peripheral edge portion 131d of the first peripheral wall body 131 and the other opening peripheral edge portion 132d of the second peripheral wall body 132 in the second fitting member 130. In the third fitting member 140 and the second fitting member 130 in the fitted state, the inner wall surface of the opening peripheral edge portion 141a of the peripheral wall body 141 and the outer wall surface of the other opening peripheral edge portion 131d of the first peripheral wall body 131 are arranged so as to be opposed to each other and the outer wall surface of the opening peripheral edge portion 141a of the peripheral wall body 141 and the inner wall surface of the other opening peripheral edge portion 132d of the second peripheral wall body 132 are arranged so as to be opposed to each other.

The housing 110 has a first lock structure 150 configured to hold the fitted state of the first and second fitting members 120 and 130 and a second lock structure 160 configured to hold the fitted state of the second and third fitting members 130 and 140 (FIG. 13 to FIG. 15).

In this case, the above-mentioned lock structure 1 is applied to the first lock structure 150. In the first lock structure 150 (lock structure 1), the engaged body 10 is provided to the first fitting member 120, and the engaging body 20 is provided to the second fitting member 130.

The members to be engaged 10 are provided on the outer wall surface side of the peripheral wall body 121 in the first fitting member 120 (FIG. 14 and FIG. 15). In the exemplified first fitting member 120, the members to be engaged 10 are provided at four locations on the outer wall surface side of the peripheral wall body 121.

Specifically, in the engaged body 10, a part of the peripheral wall body 121 in the first fitting member 120 is used to form a first engaged wall 13 (FIG. 14). Thus, the outer wall surface 13a of the first engaged wall 13 is disposed to be flush with the inner wall surface of the peripheral wall body 121. The engaged body 10 is provided to the opening peripheral edge portion 121a of the peripheral wall body 121. In the engaged body 10, the whole or part of the first engaged wall 13 protrudes to the inserting direction side into the engaging body 20 with respect to an end surface of the opening peripheral edge portion 121a of the peripheral wall body 121, so that at least the end portion 11a of the engaged main body 11 and the first communicating port 17a are arranged on the inserting direction side into the engaging body 20 with respect to the end surface of the opening peripheral edge portion 121a. In the exemplified engaged body 10, the engaged protrusion 12 and the drainage space 17 are arranged on the inserting direction side into the engaging body 20 with respect to the end surface of the opening peripheral edge portion 121a.

The engaging bodies 20 are provided to the first peripheral wall body 131 and the second peripheral wall body 132 of the second fitting member 130 (FIG. 14 and FIG. 15). In the exemplified second fitting member 130, the engaging bodies 20 are provided at four locations on the first peripheral wall body 131 and the second peripheral wall body 132 disposed so as to be opposed to each other.

Specifically, in the engaging body 20, a part of the first peripheral wall body 131 is used to form the first engaging wall 23, and a part of the second peripheral wall body 132 is used to form the second engaging wall 24 (FIG. 15). Thus, the inner wall surface 23a of the first engaging wall 23 is disposed on the same place as the outer wall surface of the first peripheral wall body 131. The exemplified second engaging wall 24, on the other hand, is arranged on the second peripheral wall body 132 so as to bulge to the side opposite to the first peripheral wall body 131. Similarly, the exemplified first covering wall portion 28a is arranged on the second peripheral wall body 132 so as to bulge to the side opposite to the first peripheral wall body 131. The engaging body 20 is provided between the opening peripheral edge portion 131c of the first peripheral wall body 131 and the opening peripheral edge portion 132c of the second peripheral wall body 132. The engaging body 20 is arranged at a position that does not protrude from end surfaces of the opening peripheral edge portions 131c and 132c. In the second fitting member 130, the third engaging wall 25, the fourth engaging wall 26, and the second covering wall portion 28b are provided as coupling wall portions that connect the first peripheral wall body 131 and the second peripheral wall body 132.

The housing 110 is provided with the first lock structure 150 (lock structure 1) in this manner, and hence a gap G2 between the outer wall surface 13a of the first engaged wall 13 and the inner wall surface 23a of the first engaging wall 23 is formed as a part of the gap between the inner wall surface of the peripheral wall body 121 and the outer wall surface of the first peripheral wall body 131. Thus, in the housing 110, the gap G2 is connected to the inner housing chamber. However, as described above, the first lock structure 150 (lock structure 1) can suppress the intrusion of the liquid W into the gap between the engaged body 10 and the engaging body 20 that is connected to the housing chamber inside the housing 110, and even when the liquid W has intruded into the gap, the intrusion of the liquid W into the gap G2 directly connected to the housing chamber can be suppressed and the intrusion amount of the liquid W into the gap G2 can be reduced. Consequently, the housing 110 can suppress the intrusion of the liquid W into the inner housing chamber.

In the housing 110, the first protruding wall 18a and the second protruding wall 18b of the engaged body 10 are continuous to the opening peripheral edge portion 121a of the peripheral wall body 121. Consequently, the housing 110 can suppress the intrusion of liquid W into a gap between the inner wall surface of the peripheral wall body 121 and the outer wall surface of the first peripheral wall body 131 around the engaged body 10.

Furthermore, in the exemplified engaged body 10, the first protruding wall 18a and the second protruding wall 18b are continuous to the opening peripheral edge portion 121a of the peripheral wall body 121 on the same plane. The outer wall surface of the opening peripheral edge portion 121a is provided with the rib-shaped protruding portion 123. In the opening peripheral edge portion 121a, the protruding portion 123 is provided at a position except for the arrangement location of the engaged body 10, and the protruding portion 123 is continuous to the third engaged wall 15 and the fourth engaged wall 16 in the orthogonal state. Thus, in the housing 110, a labyrinth structure by the opening peripheral edge portion 121a of the peripheral wall body 121, the protruding portion 123, and one opening peripheral edge portion 131c of the first peripheral wall body 131 is formed around the lock first structure 150 (lock structure 1). Thus, also in this viewpoint, the housing 110 can suppress the intrusion of the liquid W into the inner housing chamber.

In the second lock structure 160, the lock structure 1 may be applied similarly to the first lock structure 150, or a structure different from the lock structure 1 may be used. The exemplified second lock structure 160 includes an engaged body 161 provided to the third fitting member 140, and an engaging body 162 that is provided to the second fitting member 130, allows the engaged body 161 to be inserted thereinto and removed therefrom along the inserting and removing directions opposite to each other, and capable of locking the inserted engaged body 161 in the inserting direction and the removing direction (FIG. 13 to FIG. 15). The second lock structure 160 is formed such that, when the second fitting member 130 and the third fitting member 140 are fitted, for example, the claw portions of the engaged body 161 and the engaging body 162 are hooked together to lock the relative motion of the engaged body 161 and the engaging body 162 in the removing direction. The second lock structure 160 is formed such that, when the second fitting member 130 and the third fitting member 140 are fitted, for example, the engaged body 161 and the engaging body 162 are in contact with each other to prevent the further insertion of the engaged body 161 into the engaging body 162 so as to lock the relative motion of the engaged body 161 and the engaging body 162 in the inserting direction.

As described above, the lock structure 1, the electric connection box 100, and the wire harness WH in the present embodiment can suppress intrusion of liquid W into a housing chamber in the housing 110. Consequently, the lock structure 1, the electric connection box 100, and the wire harness WH can suppress performance decrease of electronic components housed in the housing chamber due to the intrusion of liquid W, and hence improve the durability.

The lock structure according to the present embodiment includes the covering portion that covers the end portion of the engaged main body on the inserting direction side, and hence the liquid directed linearly to the distal end of the end portion can be stopped by the covering portion. In the lock structure, the liquid is stopped by the covering portion, and hence the intrusion of the liquid into the gap between the outer wall surface of the first engaged wall of the engaged main body ahead of the distal end and the inner wall surface of the first engaging wall of the engaging main body can be suppressed. Thus, in the lock structure, when the gap is connected to the internal space in the first and second fitting members, the intrusion of the liquid into the internal space in the first and second fitting members through the gap can be suppressed. The electric connection box and the wire harness according to the present embodiment include the lock structure, and can obtain the same effects as those of the lock structure.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A lock structure comprising:
   an engaged body;
   an engaging body that allows the engaged body to be inserted thereinto and removed therefrom along inserting and removing directions opposite to each other, the engaging body being capable of locking the inserted engaged body in the inserting direction and the removing direction, wherein
   the engaged body includes: an engaged main body that is insertable into and removable from the engaging body; and an engaged protrusion that protrudes from an outer wall surface of the engaged main body, and
   the engaging body includes: first and second engaging walls arranged so as to be opposed to each other with a gap therebetween in a direction orthogonal to the inserting and removing directions; third and fourth engaging walls arranged so as to be opposed to each other with a gap therebetween in a direction orthogonal to the inserting and removing directions and to the direction in which the first and second engaging walls are arranged so as to be opposed to each other; a housing space that is an internal space surrounded by inner wall surfaces of the first to fourth engaging walls and in which the engaged main body is housed; an insertion port through which the engaged main body is inserted into the housing space from a distal end of an end portion thereof on the inserting direction side; a locking hole that is a through hole provided in the second engaging wall and through which the engaged protrusion is inserted when the engaged main body is housed in the housing space; a communicating port that communicates the housing space to outside on the inserting direction side of the locking hole; and a covering portion that covers an end portion of the housed engaged main body on the inserting direction side.

2. The lock structure according to claim 1, wherein the covering portion has a space on the inserting direction side with respect to the distal end of the housed engaged main body.

3. The lock structure according to claim 2, wherein the engaged body includes: a first extending wall that is extended to protrude from the engaged main body in the removing direction and is arranged so as to be opposed to the inner wall surface of the first engaging wall; a second extending wall that is extended to protrude from the engaged main body in the removing direction and is arranged so as to be opposed to the inner wall surface of the third engaging wall after the engaged body is housed; and a third extending wall that is extended to protrude from the engaged main body in the removing direction and is arranged so as to be opposed to the inner wall surface of the fourth engaging wall after the engaged body is housed.

4. The lock structure according to claim 3, wherein the engaged main body includes: first and second engaged walls that are arranged so as to be opposed to each other with a gap therebetween in the opposing arrangement direction; third and fourth wall portions to be engaged that are arranged so as to be opposed to each other with a gap therebetween in a direction orthogonal to the inserting and removing directions and to the opposing arrangement direction; a drainage space surrounded by inner wall surfaces of the first to fourth engaged walls; a first communicating port that communicates the drainage space to the outside on the inserting direction side of the engaged protrusion; and a second communicating port that communicates the drainage space to the outside on the removing direction side of the first communicating port, and
the covering portion is arranged on the inserting direction side of the first communicating port.

5. The lock structure according to claim 3, wherein the engaged body is provided on an outer wall surface side of a peripheral wall body in first fitting member, and the engaging body is provided to a first peripheral wall body and a second peripheral wall body of a second fitting member sandwiching an opening peripheral edge portion in the peripheral wall body of the first fitting member, and uses a part of the first peripheral wall body having an opening peripheral edge portion arranged so as to be opposed to an inner wall surface of the opening peripheral edge portion in the peripheral wall body to form the first engaging wall, and uses a part of the second peripheral wall body having an opening peripheral edge portion arranged so as to be opposed to an outer wall surface of the opening peripheral edge portion in the peripheral wall body to form the second engaging wall.

6. The lock structure according to claim 2, wherein
the engaged main body includes: first and second engaged walls that are arranged so as to be opposed to each other with a gap therebetween in the opposing arrangement direction; third and fourth wall portions to be engaged that are arranged so as to be opposed to each other with a gap therebetween in a direction orthogonal to the inserting and removing directions and to the opposing arrangement direction; a drainage space surrounded by inner wall surfaces of the first to fourth engaged walls; a first communicating port that communicates the drainage space to the outside on the inserting direction side of the engaged protrusion; and a second communicating port that communicates the drainage space to the outside on the removing direction side of the first communicating port, and
the covering portion is arranged on the inserting direction side of the first communicating port.

7. The lock structure according to claim 2, wherein
the engaged body is provided on an outer wall surface side of a peripheral wall body in first fitting member, and
the engaging body is provided to a first peripheral wall body and a second peripheral wall body of a second fitting member sandwiching an opening peripheral edge portion in the peripheral wall body of the first fitting member, and uses a part of the first peripheral wall body having an opening peripheral edge portion arranged so as to be opposed to an inner wall surface of the opening peripheral edge portion in the peripheral wall body to form the first engaging wall, and uses a part of the second peripheral wall body having an opening peripheral edge portion arranged so as to be opposed to an outer wall surface of the opening peripheral edge portion in the peripheral wall body to form the second engaging wall.

8. The lock structure according to claim 1, wherein
the engaged body includes: a first extending wall that is extended to protrude from the engaged main body in the removing direction and is arranged so as to be opposed to the inner wall surface of the first engaging wall; a second extending wall that is extended to protrude from the engaged main body in the removing direction and is arranged so as to be opposed to the inner wall surface of the third engaging wall after the engaged body is housed; and a third extending wall that is extended to protrude from the engaged main body in the removing direction and is arranged so as to be opposed to the inner wall surface of the fourth engaging wall after the engaged body is housed.

9. The lock structure according to claim 8, wherein
the engaged main body includes: first and second engaged walls that are arranged so as to be opposed to each other with a gap therebetween in the opposing arrangement direction; third and fourth wall portions to be engaged that are arranged so as to be opposed to each other with a gap therebetween in a direction orthogonal to the inserting and removing directions and to the opposing arrangement direction; a drainage space surrounded by inner wall surfaces of the first to fourth engaged walls; a first communicating port that communicates the drainage space to the outside on the inserting direction side of the engaged protrusion; and a second communicating port that communicates the drainage space to the outside on the removing direction side of the first communicating port, and
the covering portion is arranged on the inserting direction side of the first communicating port.

10. The lock structure according to claim 8, wherein
the engaged body is provided on an outer wall surface side of a peripheral wall body in first fitting member, and
the engaging body is provided to a first peripheral wall body and a second peripheral wall body of a second fitting member sandwiching an opening peripheral edge portion in the peripheral wall body of the first fitting member, and uses a part of the first peripheral wall body having an opening peripheral edge portion arranged so as to be opposed to an inner wall surface of the opening peripheral edge portion in the peripheral wall body to form the first engaging wall, and uses a part of the second peripheral wall body having an opening peripheral edge portion arranged so as to be opposed to an outer wall surface of the opening peripheral edge portion in the peripheral wall body to form the second engaging wall.

11. The lock structure according to claim 1, wherein
the engaged main body includes: first and second engaged walls that are arranged so as to be opposed to each other with a gap therebetween in the opposing arrangement direction; third and fourth wall portions to be engaged that are arranged so as to be opposed to each other with a gap therebetween in a direction orthogonal to the inserting and removing directions and to the opposing arrangement direction; a drainage space surrounded by inner wall surfaces of the first to fourth engaged walls; a first communicating port that communicates the drainage space to the outside on the inserting direction side of the engaged protrusion; and a second communicating port that communicates the drainage space to the outside on the removing direction side of the first communicating port, and
the covering portion is arranged on the inserting direction side of the first communicating port.

12. The lock structure according to claim 1, wherein
the engaged body is provided on an outer wall surface side of a peripheral wall body in first fitting member, and
the engaging body is provided to a first peripheral wall body and a second peripheral wall body of a second fitting member sandwiching an opening peripheral edge portion in the peripheral wall body of the first fitting member, and uses a part of the first peripheral wall body having an opening peripheral edge portion arranged so as to be opposed to an inner wall surface of the opening peripheral edge portion in the peripheral wall body to form the first engaging wall, and uses a part of the second peripheral wall body having an opening peripheral edge portion arranged so as to be opposed to an outer wall surface of the opening peripheral edge portion in the peripheral wall body to form the second engaging wall.

13. An electric connection box comprising:

a housing configured to house an electronic component therein, wherein the housing includes at least first and second fitting members to be fitted to each other, and has a lock structure configured to hold a fitted state of the first and second fitting members, the lock structure includes: an engaged body provided to the first fitting member; and an engaging body that is provided to the second fitting member, allows the engaged body to be inserted thereinto and removed therefrom along inserting and removing directions opposite to each other, and capable of locking the inserted engaged body in the inserting direction and the removing direction, the engaged body includes: an engaged main body that is insertable into and removable from the engaging body; and an engaged protrusion that protrudes from an outer wall surface of the engaged main body, and the engaging body includes: first and second engaging walls arranged so as to be opposed to each other with a gap therebetween in a direction orthogonal to the inserting and removing directions; third and fourth engaging walls arranged so as to be opposed to each other with a gap therebetween in a direction orthogonal to the inserting and removing directions and to the direction in which the first and second engaging walls are arranged so as to be opposed to each other; a housing space which is an internal space surrounded by inner wall surfaces of the first to fourth engaging walls and in which the engaged main body is housed; an insertion port through which the engaged main body is inserted into the housing space from a distal end of an end portion thereof on the inserting direction side; a locking hole which is a through hole provided in the second engaging wall and through which the engaged protrusion is inserted when the engaged main body is housed in the housing space; a communicating port that communicates the housing space to outside on the inserting direction side of the locking hole; and a covering portion that covers an end portion of the housed engaged main body on the inserting direction side.

14. A wire harness comprising:

an electronic component;

an electric wire electrically connected to the electronic component; and a housing configured to house the electronic component and the electric wire therein and lead the electric wire out to outside from inside thereof, wherein the housing includes at least first and second fitting members to be fitted to each other, and has a lock structure configured to hold a fitted state of the first and second fitting members, the lock structure includes: an engaged body provided to the first fitting member; and an engaging body that is provided to the second fitting member, allows the engaged body to be inserted thereinto and removed therefrom along inserting and removing directions opposite to each other, and capable of locking the inserted engaged body in the inserting direction and the removing direction, the engaged body includes: an engaged main body that is insertable into and removable from the engaging body; and an engaged protrusion that protrudes from an outer wall surface of the engaged main body, and the engaging body includes: first and second engaging walls arranged so as to be opposed to each other with a gap therebetween in a direction orthogonal to the inserting and removing directions; third and fourth engaging walls arranged so as to be opposed to each other with a gap therebetween in a direction orthogonal to the inserting and removing directions and to the direction in which the first and second engaging walls are arranged so as to be opposed to each other; a housing space which is an internal space surrounded by inner wall surfaces of the first to fourth engaging walls and in which the engaged main body is housed; an insertion port through which the engaged main body is inserted into the housing space from a distal end of an end portion thereof on the inserting direction side; a locking hole which is a through hole provided in the second engaging wall and through which the engaged protrusion is inserted when the engaged main body is housed in the housing space; a communicating port that communicates the housing space to outside on the inserting direction side of the locking hole; and a covering portion that covers an end portion of the housed engaged main body on the inserting direction side.

* * * * *